United States Patent
Pollak et al.

(10) Patent No.: US 10,591,518 B1
(45) Date of Patent: Mar. 17, 2020

(54) APPARATUS AND SYSTEM OF A LOW-VOLTAGE DETECTOR

(71) Applicant: TOWER SEMICONDUCTOR LTD., Migdal Haemek (IL)

(72) Inventors: Dan Pollak, Kadima-Zoran (IL); Valentin Lerner, Petah Tiqwa (IL); Sharon Brandelstein Sharkaz, Netanya (IL)

(73) Assignee: TOWER SEMICONDUCTOR LTD., Migdal Haemek (IL)

( * ) Notice: Subject to any disclaimer, the term of this patent is extended or adjusted under 35 U.S.C. 154(b) by 0 days.

(21) Appl. No.: 16/122,011

(22) Filed: Sep. 5, 2018

(51) Int. Cl.
*H03K 17/0812* (2006.01)
*G01R 19/165* (2006.01)
*H02M 3/158* (2006.01)

(52) U.S. Cl.
CPC . *G01R 19/16519* (2013.01); *G01R 19/16528* (2013.01); *H03K 17/08122* (2013.01); *H02M 3/1584* (2013.01)

(58) Field of Classification Search
CPC ....... G01R 19/16519; G01R 19/16528; H02M 3/1584; H03K 17/01822
USPC ............................ 327/63–89; 361/86–88, 92
See application file for complete search history.

(56) References Cited

U.S. PATENT DOCUMENTS

| | | |
|---|---|---|
| 2008/0247110 A1 | 10/2008 | Yamamoto |
| 2013/0141140 A1* | 6/2013 | Kumar ................. G11C 7/1057 327/108 |
| 2014/0146429 A1 | 5/2014 | Lee et al. |
| 2016/0322966 A1* | 11/2016 | Akahane ................. H03K 5/08 |

* cited by examiner

*Primary Examiner* — Tomi Skibinski
(74) *Attorney, Agent, or Firm* — Shichrur & Co.

(57) ABSTRACT

Some demonstrative embodiments include an apparatus including a low-voltage detector to detect whether a voltage difference between a first voltage of a first voltage domain and a second voltage of the first voltage domain is lower than a predefined voltage.

23 Claims, 11 Drawing Sheets

APPARATUS AND SYSTEM OF A LOW-VOLTAGE DETECTOR

TECHNICAL FIELD

Embodiments described herein generally relate to a low-voltage detector.

BACKGROUND

A Direct Current (DC) to DC converter may be configured to convert voltages from an input voltage to an output voltage, e.g., from a VIN-Ground (GND) voltage into a VOUT-GND voltage.

The DC-DC converter may include a first driver to drive a first switch, for example, based on a first voltage of a first voltage domain and a second voltage of the first voltage domain.

The DC-DC converter may include a second driver to drive a second switch, for example, based on a first voltage of a second voltage domain and a second voltage of the second voltage domain.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
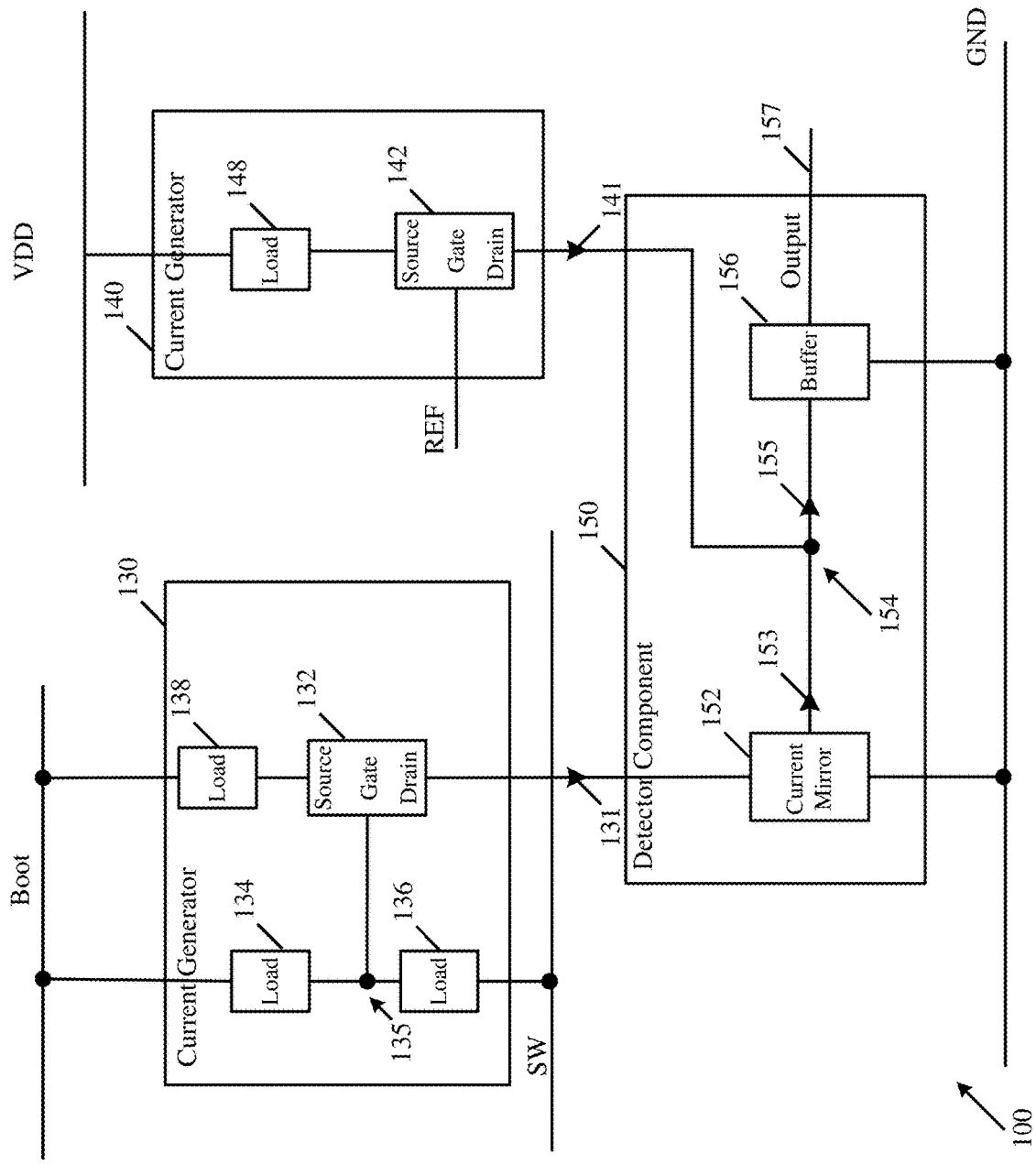
FIG. 1 is a schematic block diagram illustration of a low voltage detector, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, an electronic device, a computing device, an integrated computing device, an integrated chip, electronic circuitry, a processing device, an electrical device, a processor, a memory device, an imaging device, a digital camera device, a video device, a camera module, a medical imaging device, a mobile computer, a laptop computer, a notebook computer, a tablet computer, a handheld computer, a handheld device, a Personal Digital Assistant (PDA) device, a handheld PDA device, a mobile or portable device, a consumer device, a Smartphone and the like.

The terms "substrate" and/or "wafer", as used herein, may relate to a thin slice of semiconductor material, for example, a silicon crystal, which may be used in fabrication of integrated circuits and/or any other microelectronic devices. For example, the wafer may serve as the substrate for the microelectronic devices, which may be built in and over the wafer.

The term "Integrated Circuit" (IC), as used herein, may relate to a set of one or more electronic circuits on a semiconductor material. For example, the electronic circuit may include electronic components and their interconnectors.

Reference is made to FIG. 1, which schematically illustrates a block diagram of a low voltage detector 100, in accordance with some demonstrative embodiments.

In some demonstrative embodiments, low voltage detector 100 may include an electronic circuit.

In some demonstrative embodiments, low voltage detector 100 may include an Integrated Circuit (IC).

In one example, the electronic circuit or the IC may include, may be part of, and/or may be implemented as part of, an electronic device.

In some demonstrative embodiments, low voltage detector 100 may be implemented as part of a Direct Current (DC) to DC (DC-DC) converter, e.g., as described below.

In other embodiments, low voltage detector 100 may be implemented as part of any other electronic circuit or device.

Figure 2:
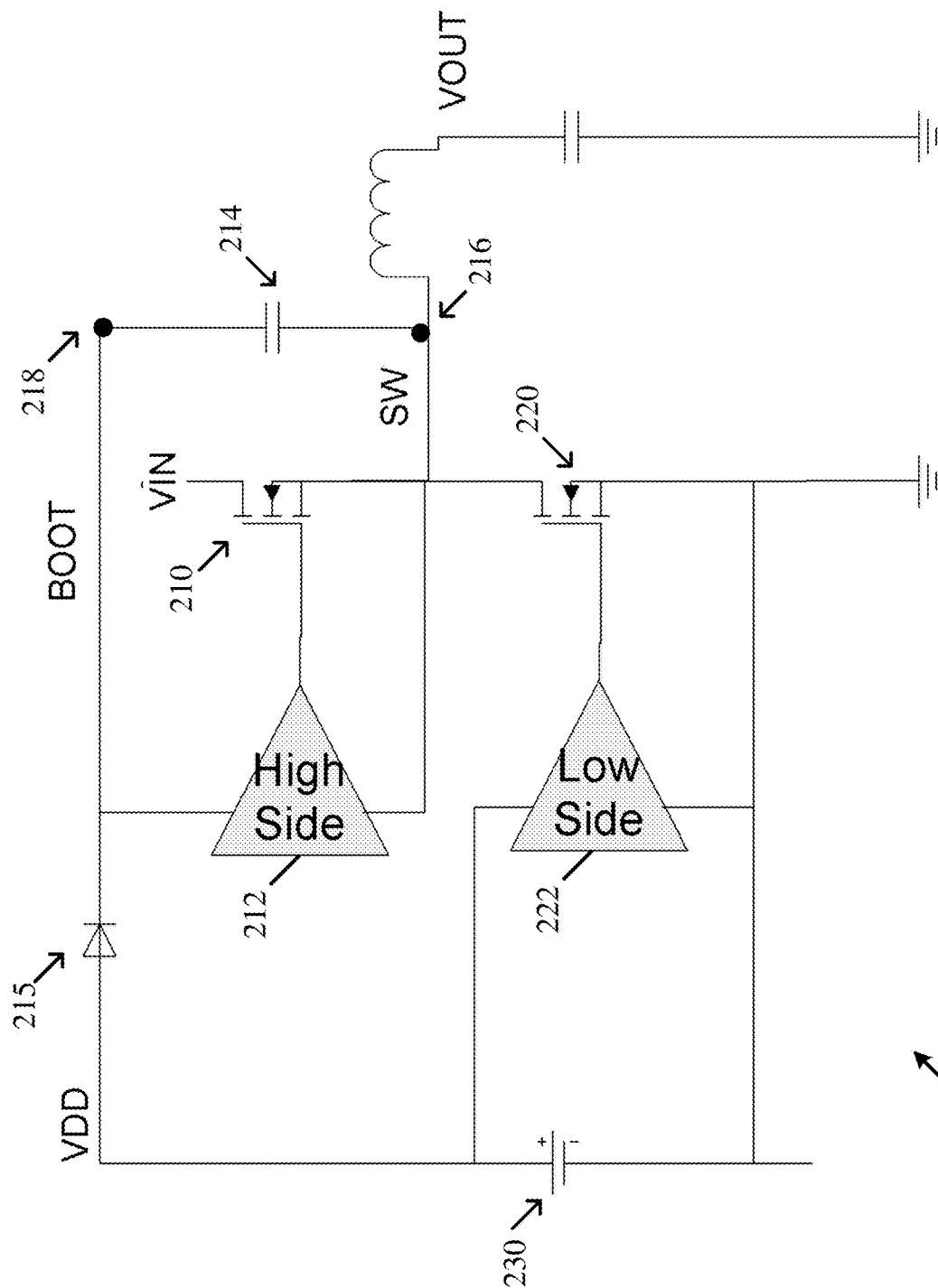
FIG. 2 is a schematic illustration of a Direct Current (DC) to DC (DC-DC) converter, which may be implemented in accordance with some demonstrative embodiments.

Reference is made to FIG. 2, which schematically illustrates a DC-DC converter 202, which may be implemented in accordance with some demonstrative embodiments.

In some demonstrative embodiments, as shown in FIG. 2, DC-DC converter 202 may be included, and/or may be implemented as part of, an electronic device, e.g., as described below with reference to FIG. 11.

In some demonstrative embodiments, DC-DC converter 202 may include a switch-mode power supply converter.

In some demonstrative embodiments, DC-DC converter 202 may include a BUCK converter or a step-down converter. In other embodiments, DC-DC converter 202 may include a BOOST converter or a step-up converter.

In other embodiments, DC-DC converter 202 may include any other converter.

In some demonstrative embodiments, as shown in FIG. 2, DC-DC converter 202 may be configured to convert DC signals from an input voltage into an output voltage, e.g., from a VIN-Ground (GND) voltage into a VOUT-GND voltage, e.g., as described below.

In some demonstrative embodiments, as shown in FIG. 2, DC-DC converter 202 may include a first driver 212 to drive a first switch 210, for example, based on a first voltage of a first voltage domain and a second voltage of the first voltage domain, e.g., as described below.

In some demonstrative embodiments, as shown in FIG. 2, DC-DC converter 202 may include a second driver 222 to drive a second switch 220, for example, based on a first voltage of a second voltage domain and a second voltage of the second voltage domain.

In some demonstrative embodiments, the first voltage domain may include a high-side voltage domain, and/or the second voltage domain may include a low-side voltage domain.

In some demonstrative embodiments, the first voltage of the first voltage domain may include a BOOT voltage, the second voltage of the first voltage domain may include a switching (SW) voltage, the first voltage of the second voltage domain may include a drain-drain voltage (VDD) voltage, and/or the second voltage of the second voltage domain may include a Ground Voltage (GND).

In some demonstrative embodiments, as shown in FIG. 2, first switch 210 may be coupled to the SW voltage. For example, switch 210 may include a high-side switch.

In some demonstrative embodiments, as shown in FIG. 2, second switch 220 may be coupled between the SW voltage and the GND voltage. For example, switch 220 may include a low-side switch.

In some demonstrative embodiments, as shown in FIG. 2, first driver 212 may be coupled between the BOOT and SW voltages. For example, driver 212 may include a high-side driver.

In some demonstrative embodiments, as shown in FIG. 2, second driver 222 may be coupled between the VDD and GND voltages. For example, driver 222 may include a low-side driver.

In some demonstrative embodiments, driver 212 may be operated by a floating voltage, for example, the BOOT voltage, e.g., a Boot-Strap-voltage.

In some demonstrative embodiments, the BOOT voltage may be generated, for example, by charging a capacitor 214, e.g., a BOOT capacitor, from voltage rails of a power source 230, for example, during a time period in which switch 220 is at an on state.

In some demonstrative embodiments, as shown in FIG. 2, the capacitor 214 may be connected between a SW node 216 and a BOOT node 218.

In some demonstrative embodiments, as shown in FIG. 2, SW node 216 may be a common node between switch 210 and switch 220.

In some demonstrative embodiments, when switch 220 is switched to the on-state, a voltage at the SW node 216 may be close to 0 Volt (V), e.g., GND voltage.

In some demonstrative embodiments, BOOT node 218 may be charged from the power rails of power source 230, e.g., through a rectifier 215, for example, a diode, e.g., a Schottky diode or a bi-polar diode.

In other embodiments, BOOT node 218 may be charged via any other rectifying device, circuit, component, and/or rectifier.

In some demonstrative embodiments, switch 210 may be switched from the off-state to the on-state, for example, using an energy stored in the BOOT capacitor 214 to operate driver 212 to drive the switch 210.

In some demonstrative embodiments, when switch 210 is at the on state, the BOOT capacitor 214 may be disconnected from power source 230, e.g., using rectifier 215. Therefore, driver 212 may rely, e.g., solely, on the energy stored in the BOOT capacitor 214.

In some demonstrative embodiments, one or more scenarios and/or use cases may cause the BOOT capacitor 214 to be incapable and/or unable to effectively and/or efficiently operate the driver 212, for example, when BOOT capacitor 214 does not have sufficient energy to operate the driver 212, e.g., as descried below.

In one example, the BOOT capacitor 214 may not be charged during the time period in which switch 220 is at the on-state, for example, to a level, which is enough to operate the driver 212.

In another example, the driver 212 may require a relatively high energy, e.g., compared to the energy stored in boot capacitor 214, for example, in order to drive switch 210.

In another example, the time period during which switch 210 is at the on-state may be long, therefore, BOOT capacitor 214 may be discharged slowly, for example, until BOOT capacitor 214 may not be able to operate driver 212 to drive switch 210. For example, in a Metal-Oxide-Semiconductor Field-Effect Transistor (MOSFET) switch, a driver may not be able to drive a gate of the MOSFET switch high enough, e.g., to maintain the MOSFET switch at the on-state, which may cause the MOSFET switch to switch to the off-state and/or to have a higher on-state resistance, e.g., higher than an expected on-state resistance.

In another example, there may be a short circuit on BOOT capacitor 214, which may reduce the energy stored in BOOT capacitor 214.

In another example, insufficient capacitance or lack of capacitance of BOOT capacitor 214, may result, for example, from a circuit failure in a circuit of DC-DC converter 202, e.g., a missing capacitor and/or any other failure in the circuit of DC-DC converter 202.

In some demonstrative embodiments, DC-DC converter 202 may include a low-voltage detector (also referred to as a "high-side Under-Voltage Lock-Out (UVLO) detector"), configured to detect, for example, when driver 212 is incapable and/or unable to operate the driver 212 to drive switch 210, e.g., as described below.

In some demonstrative embodiments, the low-voltage detector may detect, indicate and/or report, for example, whether BOOT capacitor 214 has sufficient energy to operate the driver 212.

In some demonstrative embodiments, a high-side UVLO detector may be useful or even critical, for example, in order to maintain a proper operation of DC-DC converter 202, while removing a risk of creating a short path between a supply voltage Vin and the GND voltage, which are connected to switch 220.

In one example, the short path may cause a failed operation of DC-DC converter 202.

In another example, in some use cases, the short path between the Vin voltage and the GND voltage may create a short path between the Vin voltage and a Vout voltage, which may create damage to a load, e.g., which may be connected to DC-DC converter 202.

In some demonstrative embodiments, a high-side UVLO detector may be useful or even critical, for example, to maintain a sufficient voltage, for example, in order to switch the switch 210, e.g., to the on state.

In some demonstrative embodiments, if a difference voltage between the BOOT and the SW voltages (also referred to as "BOOT-SW voltage") is too low, a resistance of switch 210 may increase and may cause excess heat in DC-DC converter 202, which may cause a failed operation of DC-DC converter 202.

In some demonstrative embodiments, accurate detection of a lower BOOT-SW voltage, e.g., lower than a predefined threshold (also referred to a "high-side UVLO event") may be important, for example, when switch 210 requires a relatively high threshold voltage, e.g., to switch the switch 210, which may decrease a margin to detect the high-side UVLO event.

In some demonstrative embodiments, in one or more architectures, circuits, and/or implementations, detecting a high-side UVLO event may be challenging, for example, if the BOOT voltage is noisy and unstable, which may make it difficult to support accurate reference voltages, e.g., a reliable bandgap voltage.

In some demonstrative embodiments, one or more architectures, circuits, and/or implementations, to detect the high-side UVLO event, may not be able to accurately detect the high-side UVLO event, and/or may have one or more inefficiencies, disadvantages and/or technical problems, e.g., as described below.

In some demonstrative embodiments, an architecture including a Zenner diode to generate a reference voltage for an under-voltage detector may have one or more disadvantages, e.g., as described below.

In one example, a voltage across the Zenner diode may not be accurate, for example, in a room temperature, and/or the Zenner diode may be temperature dependent.

In another example, a Zenner diode, which is capable of generating a reference voltage below ~3V, may be complicated and/or difficult to manufacture in a Complementary Metal-Oxide-Semiconductor (CMOS) process. For example, the fabrication process of the Zenner diode may require additional process steps, which may be costly, difficult and/or complicated.

In another example, the Zenner diode may have an increased probability to suffer from high leakage.

In some demonstrative embodiments, an architecture which is capable of detecting a UVLO event, which is based on generating an accurate reference voltage, and a bandgap circuit, e.g., in order to keep the appropriate accuracy, may have one or more disadvantages and/or technical problems, e.g., as described below.

In one example, implementing the bandgap circuit in a switching supply domain may very difficult, complicated, and/or costly, for example, since power rails tend to collapse during fast switching. Thus, the bandgap circuit in the switching supply domain may collapse itself, and due to its narrow bandwidth (BW), it may take a relatively long time to recover from this condition. For example, using the bandgap circuit in the switching supply domain may limit a performance of the bandgap circuit and an ability of the bandgap circuit to efficiently protect a driver, e.g., driver 212, from high-side UVLO, e.g., in fast transient and/or narrow pulse width operations.

In some demonstrative embodiments, an architecture based on open loop circuit configured to provide a faster response to an under-voltage condition, e.g., without operational amplifiers involved, may have one or more disadvantages.

In one example, the architecture based on the open loop circuit may not be able to accurately detect the high-side UVLO. For example, using the open loop circuit based on a threshold voltage of active devices, may result in the open loop circuit only being used as a very crude under-voltage detector.

Referring back to FIG. 1, in some demonstrative embodiments, low voltage detector 100 may be capable of detecting, e.g., quickly and/or accurately, a high-side UVLO event of floating voltage rails, for example, voltage rails of driver 212 (FIG. 2), e.g., as described below.

In some demonstrative embodiments, low-voltage detector 100 may include a high-side Under Voltage Lock-Out (UVLO) detector.

In some demonstrative embodiments, detection of a high-side UVLO event may be monitored by low-side circuitry, which make the detection easier for a controller to handle the under-voltage, e.g., as described below.

In one example, circuitry in the low-side domain of low voltage detector 100 may be configured to monitor the high-side UVLO event, which may make monitoring of the high-side UVLO event easier to handle, e.g., as described below.

In some demonstrative embodiments, low voltage detector 100 may be configured to accurately detect a high-side UVLO event on the floating voltage rails, which may be used to control a high-side switch, e.g., switch 210 (FIG. 2), in switch-mode-power-supplies, for example, in a BUCK converter architecture, e.g., as described below.

In some demonstrative embodiments, low voltage detector 100 may be capable of performing a fast detection, e.g., even in fast-transient conditions, e.g., as described below.

In some demonstrative embodiments, low voltage detector 100 may be configured to enable a reliable driver operation, for example, of driver 212 (FIG. 2), e.g., as described below.

In some demonstrative embodiments, low voltage detector 100 may be configured to monitor a high-side UVLO event in a low-side domain, which may be powered by voltage rails of low voltage detector 100, and/or may enable efficient fault handling, for example, in one or more, e.g., all, operation conditions of low voltage detector 100, e.g., as described below.

In some demonstrative embodiments, low voltage detector 100 may be configured to detect a high-side UVLO event, and to communicate the event to control circuitry in the low-side domain, which may be operated from the voltage rails, e.g., as described below.

In some demonstrative embodiments, low voltage detector 100 may be configured to exploit an accuracy achieved in a low-side domain of low voltage detector 100, which is connected to the VDD voltage and, for example, to benefit from a stable voltage, for example, in the low-side domain, e.g., as described below.

For example, low voltage detector 100 may be configured to measure a UVLO, for example, using an accuracy, which may be achieved in the low-side domain, which is connected to the VDD and GND voltages, e.g., which are more stable voltages, and, therefore, low voltage detector 100 may benefit from more stable voltage, e.g., as described below.

In some demonstrative embodiments, low voltage detector 100 may be configured to detect the high-side UVLO event in the high-side domain, e.g., between the BOOT voltage and the SW voltage, e.g., as described below.

In some demonstrative embodiments, low voltage detector 100 may be configured to send a result of the detection of the high-side UVLO event to the low-side domain, e.g., between the VDD voltage and the GND voltage. The detection of the high-side UVLO event may be accurately detected and/or compared to a reference voltage, e.g., a stable voltage, in the low-side domain, e.g., as described below.

In some demonstrative embodiments, the reference voltage may be accurately generated in the low-side domain, for example, by using a bandgap circuitry and/or any other method, which creates a stable voltage.

In some demonstrative embodiments, moving the detection to the low-side domain may provide an option for the low-side domain to handle the High-side UVLO event better, e.g., in addition to the more accurate detection of the high-side UVLO.

In some demonstrative embodiments, moving the detection to the low-side domain may enable to perform one or more operations, which may not be performed in the high-side domain, e.g., as described below.

In one example, low voltage detector 100 may be able to switch-off a high-side switch, e.g., switch 210 (FIG. 2).

In another example, low voltage detector 100 may be able to switch-off the high-side switch, e.g., switch 210 (FIG. 2), and to turn on the low-side switch, e.g., switch 220 (FIG. 2), for example, to recharge the BOOT capacitor, e.g., capacitor 214 (FIG. 2).

In another example, low voltage detector 100 may be able to switch-off the electronic device.

In another example, low voltage detector 100 may be able to perform any combination of the examples above and/or any additional and/or alternative operations, for example, using a smart logic and/or a delay operation, e.g., when detecting a fault condition of the high-side UVLO.

In some demonstrative embodiments, low voltage detector 100 may be configured to detect whether a voltage difference between a first voltage of a first voltage domain and a second voltage of the first voltage domain is lower than a predefined voltage, e.g., as described below.

In some demonstrative embodiments, the first voltage domain may include the high-side voltage domain.

In some demonstrative embodiments, the first voltage of the first voltage domain may include the BOOT voltage and/or the second voltage of the first voltage domain may include the SW voltage.

In other embodiments, the first voltage of the first voltage domain and/or the second voltage of the first voltage domain may include any other voltages.

For example, low voltage detector 100 may be configured to detect whether a voltage difference between the BOOT voltage and the SW voltage, e.g., the BOOT-SW voltage, is lower than a predefined voltage, e.g., as described below.

In some demonstrative embodiments, low voltage detector 100 may include a first current generator 130 configured to generate a first reference current 131 based on a difference between the first voltage of the first voltage domain and the second voltage of the first voltage domain, for example, based on the BOOT-SW voltage, e.g., as described below.

In some demonstrative embodiments, low voltage detector 100 may include a second current generator 140 to generate a second reference current 141 based on a difference between a first voltage of a second voltage domain and a reference voltage.

In some demonstrative embodiments, the second voltage domain may include the low-side voltage domain.

In some demonstrative embodiments, the first voltage of the second voltage domain may include a VDD voltage, and a second voltage of the second voltage domain may include the GND voltage.

In other embodiments, the first voltage of the second voltage domain and/or the second voltage of the second voltage domain may include any other voltages.

In some demonstrative embodiments, the reference voltage may include a bandgap voltage.

In one example, current generator 140 may generate the second reference current 141, for example, based on a difference between the VDD voltage and the bandgap voltage.

In some demonstrative embodiments, low voltage detector 100 may include a detector component 150 to detect whether the voltage difference, e.g., the BOOT-SW voltage, is lower than the predefined voltage, for example, based on the first reference current 131 and the second reference current 141, e.g., as described below.

In one example, detector component 150 may be configured to detect whether the voltage difference between the BOOT voltage and the SW voltage, e.g., BOOT-SW, is lower than the predefined voltage based on the first reference current 131 and the second reference current 141.

In some demonstrative embodiments, detector component 150 may be configured to detect whether the voltage difference is lower than the predefined voltage, for example, when the first voltage domain is at a switching mode and the second voltage domain is at a fixed mode, e.g., as described below.

In some demonstrative embodiments, detector component 150 may include a current mirror 152 configured to generate a mirrored reference current 153 based on the first reference current 131, e.g., as described below.

In some demonstrative embodiments, detector component 150 may be configured to detect whether the voltage difference is lower than the predefined voltage, for example, based on a comparison between the mirrored reference current 153 and the second reference current 141, e.g., as described below.

In some demonstrative embodiments, detector component 150 may include a comparison node 154 between the current mirror 152 and the second current generator 140, e.g., as described below.

In some demonstrative embodiments, the comparison node 154 may be configured to provide a current difference 155 between the mirrored reference current 153 and the second reference current 141, e.g., as described below.

In some demonstrative embodiments, detector component 150 may include a comparison buffer 156 to receive the current difference 155 from the comparison node 154, e.g., as described below.

In some demonstrative embodiments, detector component 150 may be configured to output a signal 157 to indicate that the voltage difference is lower than the predefined voltage, for example, based on the current difference 155, e.g., as described below.

In some demonstrative embodiments, current generator 130 may include a first MOS transistor 132, e.g., as described below.

In some demonstrative embodiments, the first reference current 131 may be driven via a drain of the first MOS transistor 132, e.g., as described below.

In some demonstrative embodiments, current generator 140 may include a second MOS transistor 142, e.g., as described below.

In some demonstrative embodiments, the second reference current 141 may be driven via a drain of the second MOS transistor 142, e.g., as described below.

In some demonstrative embodiments, MOS transistors 132 and/or 142 may include a P-channel MOS (PMOS) transistor, a high voltage MOS transistor, or a Lateral Diffused MOS (LDMOS) transistor, e.g., as described below.

In other embodiments, MOS transistors 132 and/or 142 may include any other transistors.

In some demonstrative embodiments, current generator 130 may include a first load 134 and a second load 136 coupled in series between the BOOT voltage and the SW voltage, and a third load 138 between the BOOT voltage and a source of MOS transistor 132, e.g., as described below.

In some demonstrative embodiments, a gate voltage of MOS transistor 132 may include a voltage at a node 135 between the loads 134 and 136, e.g., as described below.

In some demonstrative embodiments, current generator 140 may include a fourth load 148 between the VDD voltage and a source of MOS transistor 142, e.g., as described below.

In some demonstrative embodiments, a gate voltage of MOS transistor 142 may include the reference voltage, e.g., as described below.

In some demonstrative embodiments, loads 134 and 136 may be equal, loads 138 and 148 may be equal, and/or MOS transistors 132 and 142 may be identical, e.g., as described below.

Figure 3:
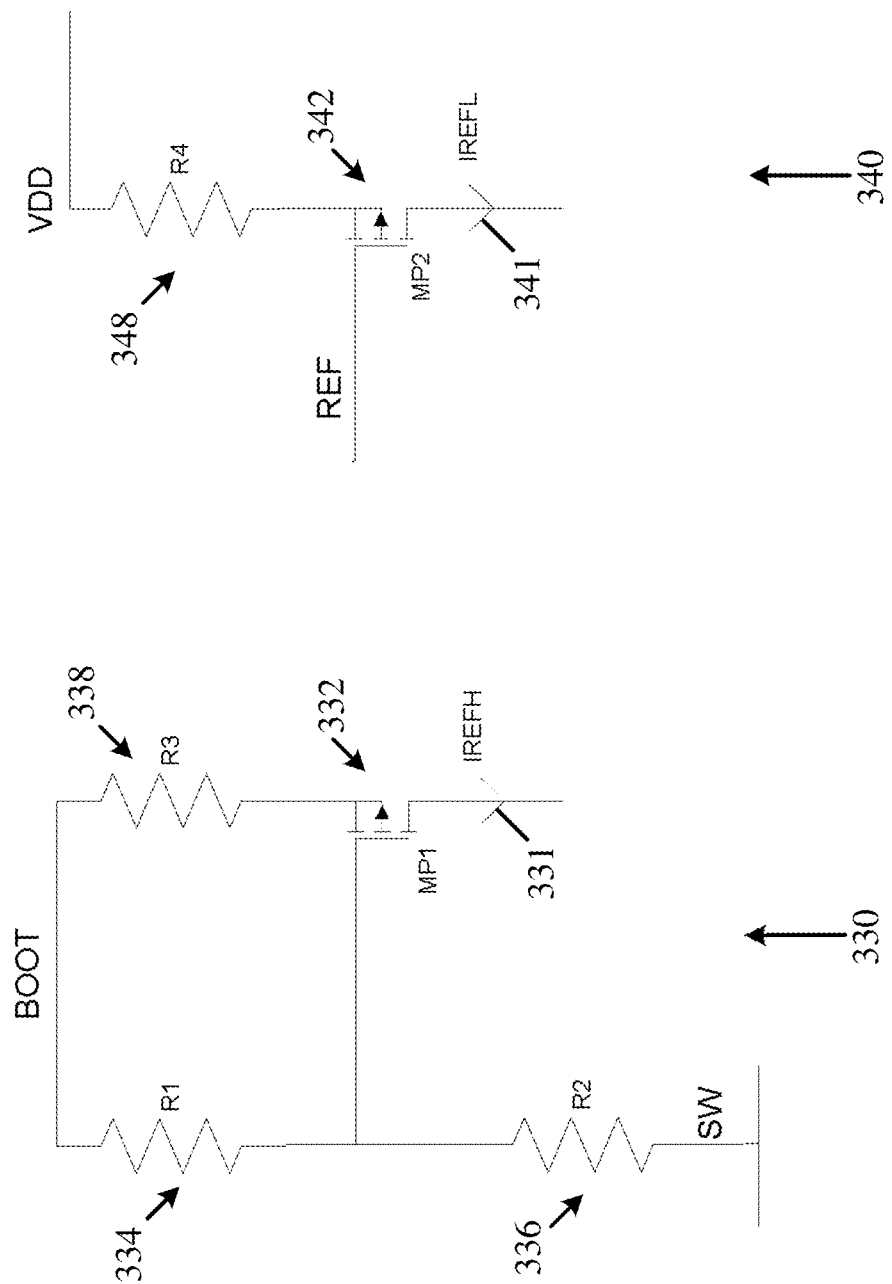
FIG. 3 is a schematic illustration of a first current generator architecture and a second current generator architecture, in accordance with some demonstrative embodiments.

Reference is made to FIG. 3, which schematically illustrates a first current generator architecture 330 and a second current generator architecture 340, in accordance with some demonstrative embodiments.

In one example, current generator 330 may be configured to perform the functionality of, one or more operations of, one or more functionalities of, and/or the role of current generator 130 (FIG. 1), and/or current generator 340 may be configured to perform the functionality of, one or more operations of, one or more functionalities of, and/or the role of current generator 140 (FIG. 1).

In one example, current generator 130 (FIG. 1) may include one or more elements and/or components of current generator 330, and/or current generator 140 (FIG. 1) may include one or more elements and/or components of current generator 340.

In some demonstrative embodiments, as shown in FIG. 3, current generator 330 may include a first MOS transistor 332, denoted "MP1", e.g., as described below.

In some demonstrative embodiments, as shown in FIG. 3, a first reference current 331, denoted "IREFH", may be driven via a drain of the first MOS transistor 332, e.g., as described below.

In some demonstrative embodiments, as shown in FIG. 3, current generator 340 may include a second MOS transistor 342, denoted "MP2", e.g., as described below.

In some demonstrative embodiments, as shown in FIG. 3, a second reference current 341, denoted "IREFL", may be driven via a drain of the second MOS transistor 342, e.g., as described below.

In some demonstrative embodiments, as shown in FIG. 3, MOS transistor 332 and/or MOS transistor 342 may include PMOS transistors and/or any other type of transistors.

In some demonstrative embodiments, as shown in FIG. 3, current generator 330 may include a first load 334, denoted "R1", and a second load 336, denoted "R2", coupled in series between the BOOT voltage and the SW voltage, and a third load 338, denoted "R3", between the BOOT voltage and a source of MOS transistor 332, e.g., as described below.

In some demonstrative embodiments, as shown in FIG. 3, a gate voltage of MOS transistor 332 may include a voltage at a node between the loads 334 and 336, e.g., as described below.

In some demonstrative embodiments, as shown in FIG. 3, current generator 340 may include a fourth load 348, denoted "R4", between the VDD voltage and a source of MOS transistor 342, e.g., as described below.

In some demonstrative embodiments, as shown in FIG. 3, a gate voltage of MOS transistor 342 may include a reference voltage, denoted "REF", e.g., as described below.

In one example, low voltage detector 100 (FIG. 1) may be configured to perform fast comparison of two reference current sources, e.g., currents 331 and 341, which may be generated in the high-side domain and the low-side domain, respectively, e.g., as described below In some demonstrative embodiments, the low-side current reference, e.g., reference current 341, may be generated, for example, based on the reference voltage REF.

In some demonstrative embodiments, the reference current IREFL may be determined, e.g., as follows:

$$IREFL = (VDD - REF - VSG2)/R4 \quad (1)$$

In some demonstrative embodiments, the high-side current reference, e.g., reference current 331, may be generated by driving the gate of the MOS transistor MP1 with a reference voltage, which is correlated with the power rails voltage, for example, the difference between the BOOT-SW voltage, e.g., as follows:

$$IREFH = ((BOOT - SW) * R1/(R1+R2) - VSG1)/R3 \quad (2)$$

In some demonstrative embodiments, there may be a relatively good matching between currents 331 and 341, for example, in order to precisely detect the high-side voltage.

In some demonstrative embodiments, loads 334 and 336 may be equal, loads 338 and 348 may be equal, and/or MOS transistors 332 and 342 may be identical, e.g., as described below.

In one example, when MP2=MP1, e.g., hence VSG1=VSG2, R3=R4 and R1=R2, Equations 1 and 2 may be expressed, e.g., as follows:

$$IREFL = (VDD - REF - VSG1)/R3$$

$$IREFH = ((BOOT - SW)/2 - VSG1)/R3 \quad (3)$$

Figure 4:
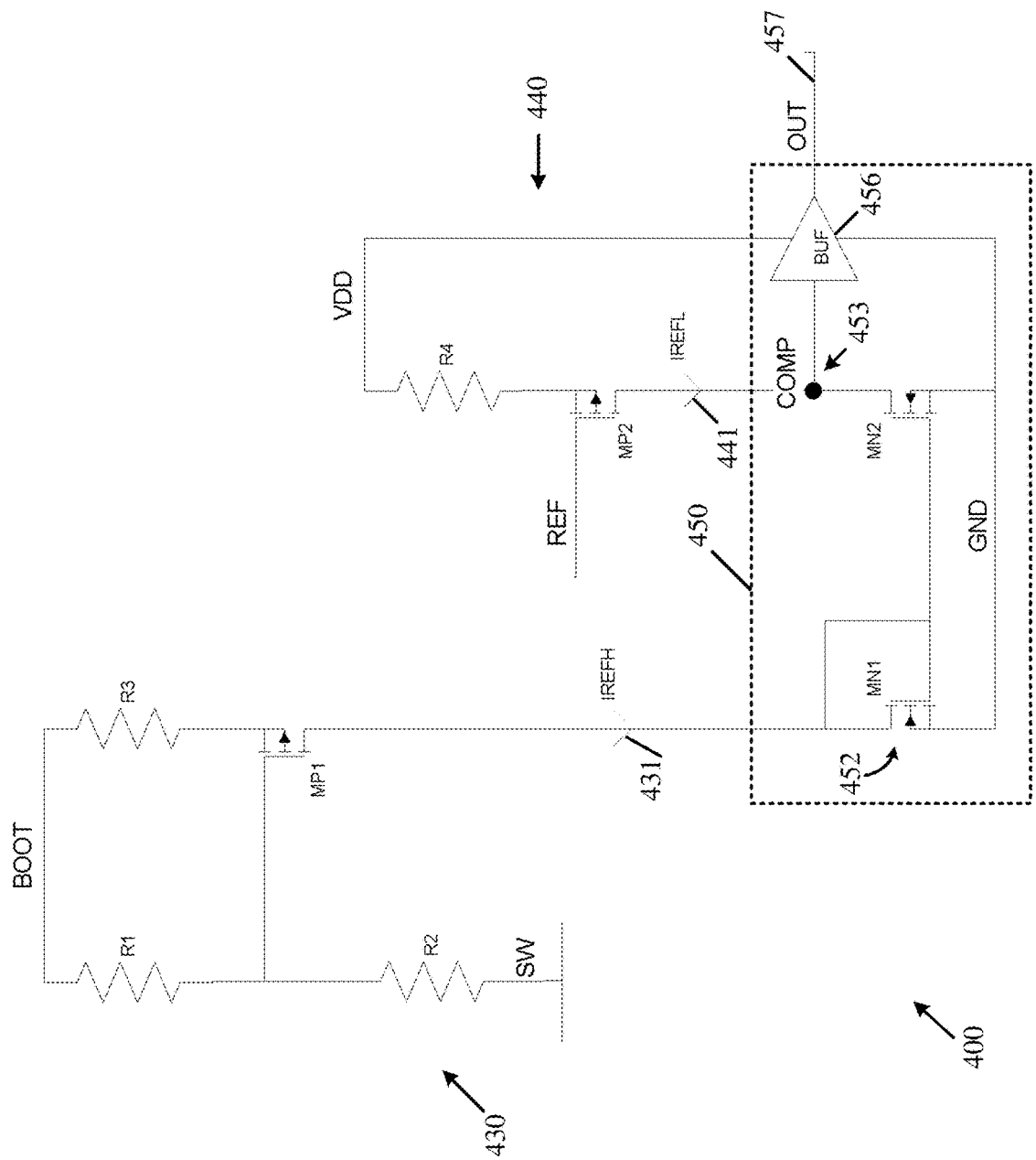
FIG. 4 is a schematic illustration of a low voltage detector architecture, in accordance with some demonstrative embodiments.

Reference is made to FIG. 4, which schematically illustrates a low voltage detector architecture 400, in accordance with some demonstrative embodiments.

In one example, low voltage detector 400 may be configured to perform the functionality of, one or more operations of, one or more functionalities of, and/or the role of low voltage detector 100 (FIG. 1).

In one example, low voltage detector 100 (FIG. 1) may include one or more elements and/or components of low voltage detector 400.

In some demonstrative embodiments, as shown in FIG. 4, low voltage detector 400 may include a first current generator 430 to generate a first reference current 431, denoted "IREFH", and a second current generator 440 to generate a second reference current 441, denoted "IREFL". For example, current generator 430 may include, may be configured to perform the functionality of, one or more operations of, one or more functionalities of, and/or may perform the role of current generator 330 (FIG. 3), and/or current generator 440 may include, may be configured to perform the functionality of, one or more operations of, one or more functionalities of, and/or may perform the role of current generator 340 (FIG. 3).

In some demonstrative embodiments, as shown in FIG. 4, low voltage detector 400 may include a detector component 450. For example, detector component 450) may include, may be configured to perform the functionality of, one or more operations of, one or more functionalities of, and/or may perform the role of detector component 150 (FIG. 1).

In one example, detector component 150 (FIG. 1) may include one or more elements and/or components of detector component 450.

In some demonstrative embodiments, as shown in FIG. 4, detector component 450 may include a current mirror 452 configured to generate a mirrored reference current 453 based on reference current 431, e.g., as described below.

In some demonstrative embodiments, as shown in FIG. 4, detector component 450 may include a comparison node, denoted "COMP", between the current mirror 452 and the current generator 440.

In some demonstrative embodiments, the comparison node COMP may be configured to provide a current difference between the mirrored reference current 453 and reference current 441.

In some demonstrative embodiments, as shown in FIG. 4, detector component 450 may include a comparison buffer 456, denoted "BUF", to receive the current difference from the comparison node, and, based on the current difference, to output a signal 457, denoted "OUT", to indicate that a voltage difference BOOT-SW is lower than a predefined voltage, e.g., as described below.

In some demonstrative embodiments, as shown in FIG. 4, reference current 431, e.g., the IREFH current, may be mirrored by a first MOS transistor, denoted "MN1", and a second MOS transistor, denoted, "MN2".

In some demonstrative embodiments, when setting the transistors MN1 and MN2 to be identical, e.g., MN1=MN2, the comparison node COMP, may perform a comparison between reference currents 431 and 441

In some demonstrative embodiments, the signal OUT 457 may trip, for example, if IREFL=IREFH, and therefore:

$$(VDD-REF-VSG1)/R3=((BOOT-SW)/2-VSG1)/R3 \qquad (4)$$

For example, Equation 4 may be simplified, e.g., as follows:

$$VDD-REF=(BOOT-SW)/2 \qquad (5)$$

In some demonstrative embodiments, low voltage detector 400 may enable a fast comparison of two reference current sources generated in the high-side domain and the low-side domain, e.g., reference currents 131 and 141, respectively.

In some demonstrative embodiments, as shown by Equation 5, setting the reference voltage REF, may allow detecting the voltage difference BOOT-SW accurately, for example, to determine whether the voltage difference BOOT-SW is lower than a predefined voltage.

In some demonstrative embodiments, setting the reference voltage REF and operating detector component 450 at the low-side domain may enable accurate level detection of the voltage difference BOOT-SW.

In some demonstrative embodiments, the quiet rails of the low-side domain, e.g., the GND voltage and the VDD voltage, may enable a generation of a bandgap voltage, e.g., the voltage reference REF, which may set an accurate voltage reference.

In some demonstrative embodiments, detection of the voltage difference BOOT-SW may benefit from the quietness of the low-side power rails, while current generator 440, which is a simple current reference generation, may be left in the high-side domain.

In some demonstrative embodiments, low voltage detector 400 may be implemented, for example, to enable a fast response of an under-voltage-protection circuit.

For example, BOOT and SW may be switching nodes, which may be continuously switching during operation in a very fast rate. Accordingly, using MOS transistor MN1 as an element in current mirror 452 may achieve a low impedance node on the reference current IREFH, which may reduce the settling time of a gate of the MOS transistor MN1.

In some demonstrative embodiments, a fast settling of the gate of the MOS transistor MN1, and subsequently over the current mirror MOS transistor MN2, may enable fast detection of high-side UVLO, which may help to protect against fault scenarios.

In some demonstrative embodiments, as shown in FIG. 4, current generator 430 may include loads R1, R2, R3 and MOS transistor MP1 to generate the reference current IREF1, which may be proportional to the voltage difference BOOT-SW voltage, e.g., as follows:

$$IREFH=(VDD-REF-VSG)/R3=((BOOT-SW)/2-VGS1)/R3 \qquad (6)$$

In some demonstrative embodiments, as shown in FIG. 4, current generator 440 may include load R4, MOS transistor MP4, and an input to be driven by the voltage reference REF, to generate the reference current IREF2, which may be proportional to a voltage difference VDD−VREF, e.g., as follows:

$$IREFL=(VDD-REF-VSG)/R4 \qquad (7)$$

In some demonstrative embodiments, as shown in FIG. 4, current mirror 452 may include MOS transistors MN1 and MN2 to generate a mirror current, which may be proportional to sense the reference current IREFH.

In some demonstrative embodiments, as shown in FIG. 4, the comparison node VCOMP, may be configured to short IREFL to an output of current mirror 452, e.g., a Drain of MOS transistor MN2.

In some demonstrative embodiments, as shown in FIG. 4, an input of comparison buffer VCOMP 456 may be connected to the comparison node VCOMP and may generate output signal 457.

Figure 5:
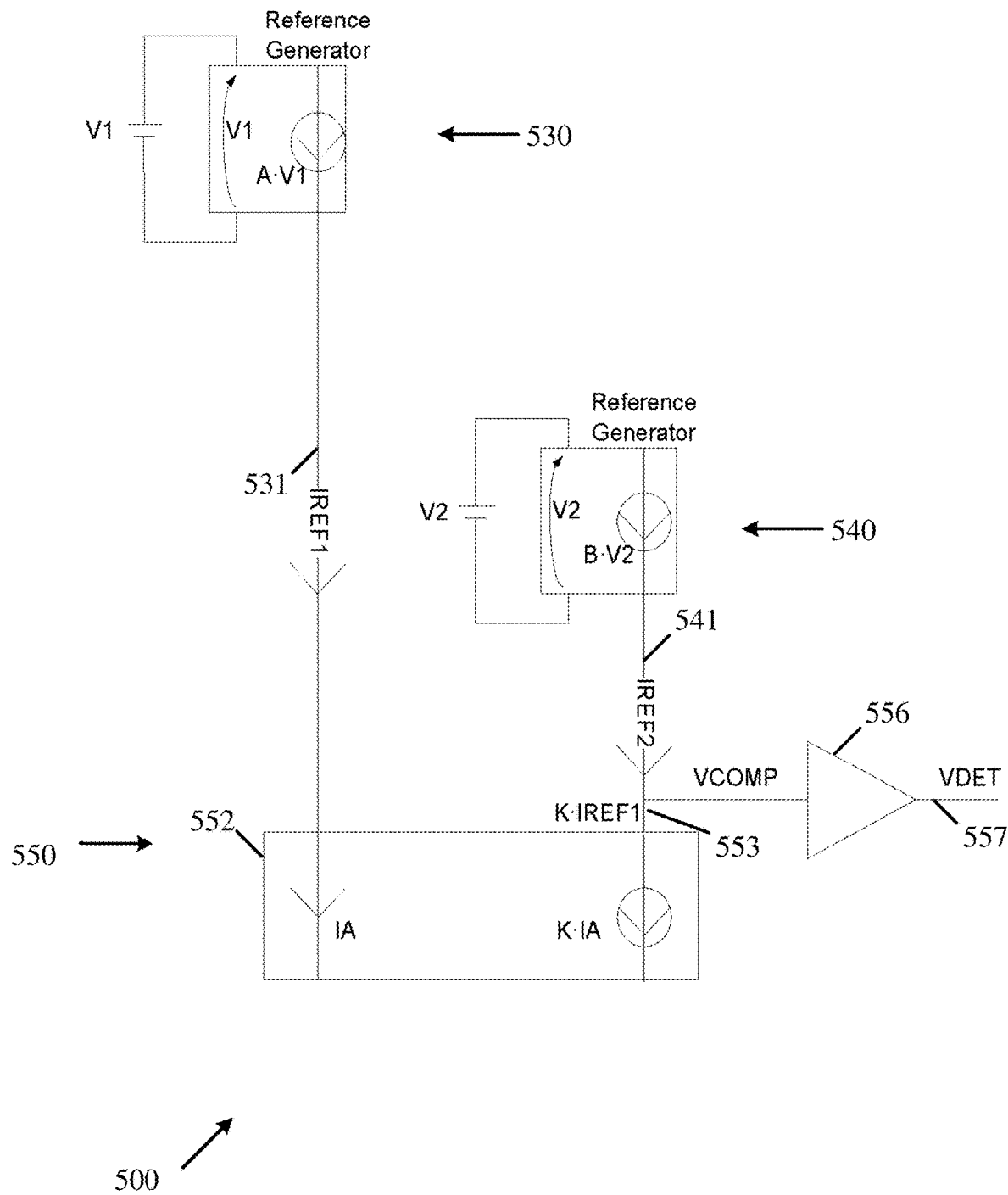
FIG. 5 is a schematic illustration of architecture of a low voltage detector architecture, in accordance with some demonstrative embodiments.

Reference is made to FIG. 5, which schematically illustrates low voltage detector architecture 500, in accordance with some demonstrative embodiments.

In one example, low voltage detector 500 may be configured to perform the functionality of, one or more operations of, one or more functionalities of, and/or the role of low voltage detector 100 (FIG. 1).

In some demonstrative embodiments, as shown in FIG. 5, low voltage detector 500 may include a first current generator 530 to generate a first reference current 531, denoted "IREF1", and a second current generator 540 to generate a second reference current 541, denoted "IREF2". For example, current generator 530 may include, may be configured to perform the functionality of, one or more operations of, one or more functionalities of, and/or may perform the role of current generator 430 (FIG. 4), and/or current generator 540 may include, may be configured to perform the functionality of, one or more operations of, one or more functionalities of, and/or may perform the role of current generator 440 (FIG. 4).

In some demonstrative embodiments, as shown in FIG. 5, low voltage detector 500 may include a detector component 550. For example, detector component 550) may include, may be configured to perform the functionality of, one or more operations of, one or more functionalities of, and/or may perform the role of detector component 450 (FIG. 1).

In some demonstrative embodiments, as shown in FIG. 5, detector component 550 may include a current mirror 552 configured to generate a mirrored reference current 553 based on reference current 531, e.g., as described below.

In some demonstrative embodiments, as shown in FIG. 5, detector component 550 may include a comparison node, denoted "COMP" between the current mirror 552 and the current generator 540.

In some demonstrative embodiments, the comparison node COMP may be configured to provide a current difference between the mirrored reference current 553 and reference current 541.

In some demonstrative embodiments, as shown in FIG. 5, detector component 550 may include a comparison buffer 556, configured to receive the current difference from the comparison node, and, based on the current difference, to output a signal 557, denoted "VDET", to indicate that a voltage difference BOOT-SW is lower than a predefined voltage, e.g., as described below.

In some demonstrative embodiments, low voltage detector 500 may be configured to detect the voltage difference BOOT-SW for the high-side voltage domain in the low-side voltage domain, for example, when the high-side voltage domain is switching and the low-side voltage domain is fixed. For example, low voltage detector 500 may be configured to detect a high-side under-voltage event in the low-side domain, e.g., in a switch-mode power supply, for example, when the high-side voltage domain is switching and the low-side voltage domain is a fixed voltage domain.

In some demonstrative embodiments, low voltage detector 500 may be configured to detect the voltage difference BOOT-SW in buck converters, boost converters, buck/boost converters, and/or any other type of converter.

In some demonstrative embodiments, as shown in FIG. 5, current generator 530 may generate the reference current IREF1, which may be proportional to a first voltage, denoted V1, e.g., the BOOT-SW voltage, e.g., IREF=A·V1.

In some demonstrative embodiments, as shown in FIG. 5, current generator 540 may generate the reference current IREF2, which may be proportional to a second voltage, denoted V2, e.g., the reference REF voltage, e.g., IREF2=B·V2.

In some demonstrative embodiments, as shown in FIG. 5, current mirror 552 may include a current copier, which may generate a mirror current denoted KIA, e.g., K·IA=K·IREF1, which may be proportional to a current, denoted "IA", which is connected to IREF1.

In some demonstrative embodiments, as shown in FIG. 5, the comparison node VCOMP, may compare two reference currents, e.g., the reference currents IREF2 and K·IREF1, for example, by shorting between IREF2 and K·REF1.

In some demonstrative embodiments, as shown in FIG. 5, comparison buffer VCOMP 556 may include a voltage detector, which may be configured to compare the BOOT-SW voltage to a reference level and to generate signal 557, e.g., logic signal VDET.

Referring back to FIG. 1, in some demonstrative embodiments, low voltage detector 100 may include one or more elements and/or components configured to improve and/or increase performance, stability and/or accuracy of low voltage detector 100, e.g., as described below.

In some demonstrative embodiments, detector component 150 may include a three state buffer coupled between the comparison node 154 and an output of the comparison buffer 156, e.g., as described below with reference to FIG. 6.

In some demonstrative embodiments, the three state buffer may be configured to latch the comparison node 154 to the output of the comparison buffer 156, for example, based on a detection of a transient event in the high-side voltage domain, e.g., as described below.

In some demonstrative embodiments, the three state buffer may be applied for example, to better handle BOOT-SW transients. For example, the three-state buffer may be activated during transient events, for example, in order to hold comparison node 154 stable, and/or to enable a fast convergence of comparison node 154, for example, once the transient is completed.

In some demonstrative embodiments, in some cases the three state buffer may function, for example, in the presence of high voltage high-side domain.

In some demonstrative embodiments, the MOS transistors 132 and/or 142 may include high-voltage devices or Lateral diffused MOS (LDMOS) devices, for example, in the presence of the high voltage high-side domain.

In some demonstrative embodiments, low voltage detector 100 may include a transient detection circuit configured to detect the transient event, e.g., as described below with reference to FIG. 6.

In some demonstrative embodiments, the transient detection circuit may be configured to detect the transient event, and, based on the detection of the transient event, to provide a transient signal to an input of the three state buffer, for example, in order to enable an output of the three state buffer, e.g., as described below.

Figure 6:
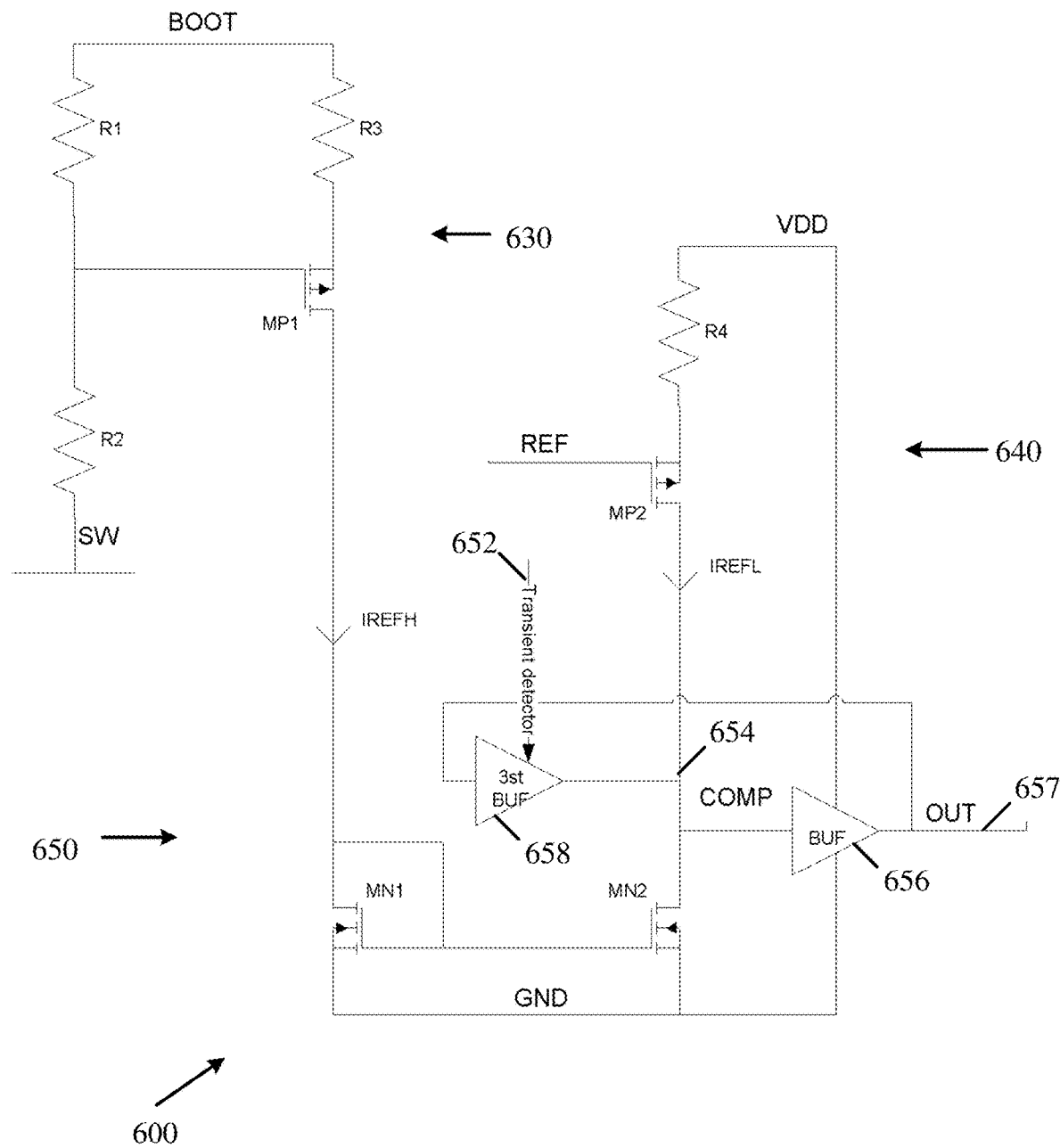
FIG. 6 is a schematic illustration of a low voltage detector architecture, in accordance with some demonstrative embodiments.

Reference is made to FIG. 6, which schematically illustrates low voltage detector architecture 600, in accordance with some demonstrative embodiments.

In one example, low voltage detector 600 may be configured to perform the functionality of, one or more operations of, one or more functionalities of, and/or the role of low voltage detector 100 (FIG. 1).

In one example, low voltage detector 100 (FIG. 1) may include one or more elements and/or components of low voltage detector 600.

In some demonstrative embodiments, as shown in FIG. 6, low voltage detector 600 may include a first current generator 630 to generate a first reference current 631, denoted "IREFH", and a second current generator 640 to generate a second reference current 541, denoted "IREFL". For example, current generator 630 may include, may be configured to perform the functionality of, one or more operations of, one or more functionalities of, and/or may perform the role of current generator 430 (FIG. 4), and/or current generator 640 may include, may be configured to perform the functionality of, one or more operations of, one or more functionalities of, and/or may perform the role of current generator 440 (FIG. 4).

In some demonstrative embodiments, as shown in FIG. 6, low voltage detector 600 may include a detector component 650. For example, detector component 150 (FIG. 1) may include, may be configured to perform the functionality of, one or more operations of, one or more functionalities of, and/or may perform the role of detector component 650.

In some demonstrative embodiments, as shown in FIG. 6, detector component 650 may include a three state buffer 658 coupled between a comparison node 654 and an output of a comparison buffer 656.

In some demonstrative embodiments, as shown in FIG. 6, the three state buffer 658 may be configured to latch the comparison node 654 to the output of the comparison buffer 656, for example, based on a detection of a transient event in the high-side voltage domain, e.g., as described below.

For example, three state buffer 658 may latch comparison node 654 to an OUT signal 657, while a control input 652 of the three state buffer 658 indicates the transient event, e.g., "Transient-Detector" is "high".

In some demonstrative embodiments, low voltage detector 600 may include a transient detection circuit configured to detect the transient event and to provide the transient signal to the control input 652 of the three state buffer 658, for example, in order to enable an output of the three state buffer 658.

For example, the transient detection circuit may detect transients in BOOT voltage or SW voltage and may generate a signal to indicate the transient event, e.g., a "HIGH" signal "Transient-Detector".

Referring back to FIG. 1, in some demonstrative embodiments, first current generator 130 may include a high voltage transistor configured to prevent a voltage stress over the first MOS transistor 132, e.g., as described below with reference to FIG. 7.

In some demonstrative embodiments, a source of the high voltage transistor may be coupled to the drain of the first MOS transistor 132, e.g., as described below with reference to FIG. 7.

In some demonstrative embodiments a gate of the high voltage transistor may be coupled to a reference voltage of the high-side voltage domain, e.g., as described below with reference to FIG. 7.

In some demonstrative embodiments, the high voltage transistor may include an LDMOS transistor. In other embodiments, the high voltage transistor may include any other transistor.

Figure 7:
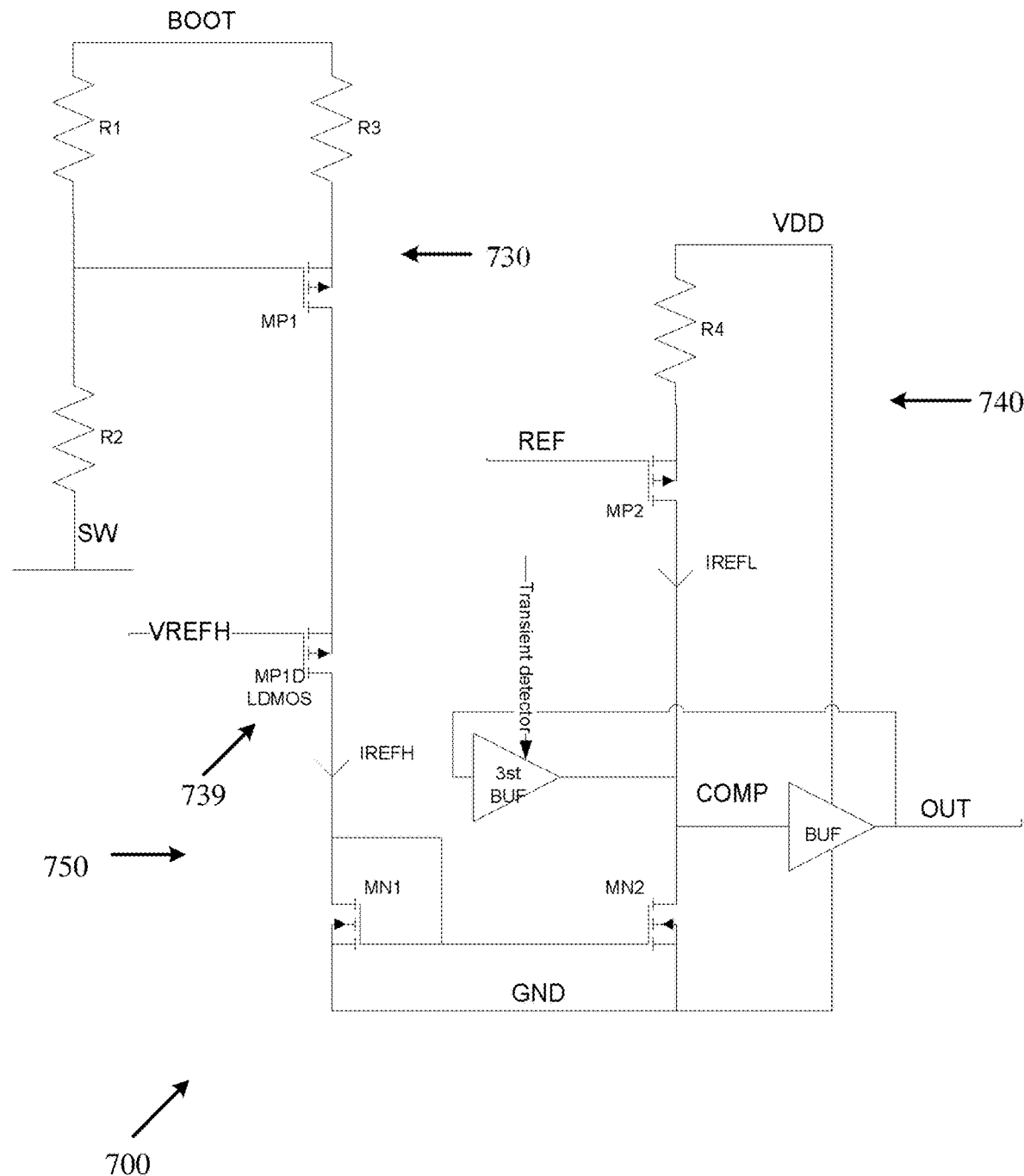
FIG. 7 is a schematic illustration of a low voltage detector architecture, in accordance with some demonstrative embodiments.

Reference is made to FIG. 7, which schematically illustrates a low voltage detector architecture 700, in accordance with some demonstrative embodiments.

In one example, low voltage detector 700 may be configured to perform the functionality of, one or more operations of, one or more functionalities of, and/or the role of low voltage detector 100 (FIG. 1).

In one example, low voltage detector 100 (FIG. 1) may include one or more elements and/or components of low voltage detector 700.

In some demonstrative embodiments, as shown in FIG. 7, low voltage detector 700 may include a first current generator 730 to generate a first reference current 731, denoted "IREFH", and a second current generator 740 to generate a second reference current 741, denoted "IREFL". For example, current generator 730 may include, may be configured to perform the functionality of, one or more operations of, one or more functionalities of, and/or may perform the role of current generator 630 (FIG. 6), and/or current generator 740 may include, may be configured to perform the functionality of, one or more operations of, one or more functionalities of, and/or may perform the role of current generator 640 (FIG. 6).

In some demonstrative embodiments, as shown in FIG. 7, low voltage detector 700 may include a detector component 750. For example, detector component 750 may include, may be configured to perform the functionality of, one or more operations of, one or more functionalities of, and/or may perform the role of detector component 650 (FIG. 6).

In some demonstrative embodiments, as shown in FIG. 7, first current generator 730 may include a high voltage transistor 739, denoted "LP1D", configured to prevent a voltage stress over a MOS transistor, denoted "MP1", of first current generator 730.

In some demonstrative embodiments, as shown in FIG. 7, a source of the high voltage transistor 739 may be coupled to the drain of the MOS transistor MP1.

In some demonstrative embodiments, as shown in FIG. 7, a gate of the high voltage transistor 739 of the high voltage transistor may be coupled to a reference voltage, denoted "VREFH".

In some demonstrative embodiments, low voltage detector 700 may include a voltage clamping component configured to clamp a drain of the MOS transistor MP1, e.g., as described below with reference to FIG. 8 and/or FIG. 9.

Figure 8:
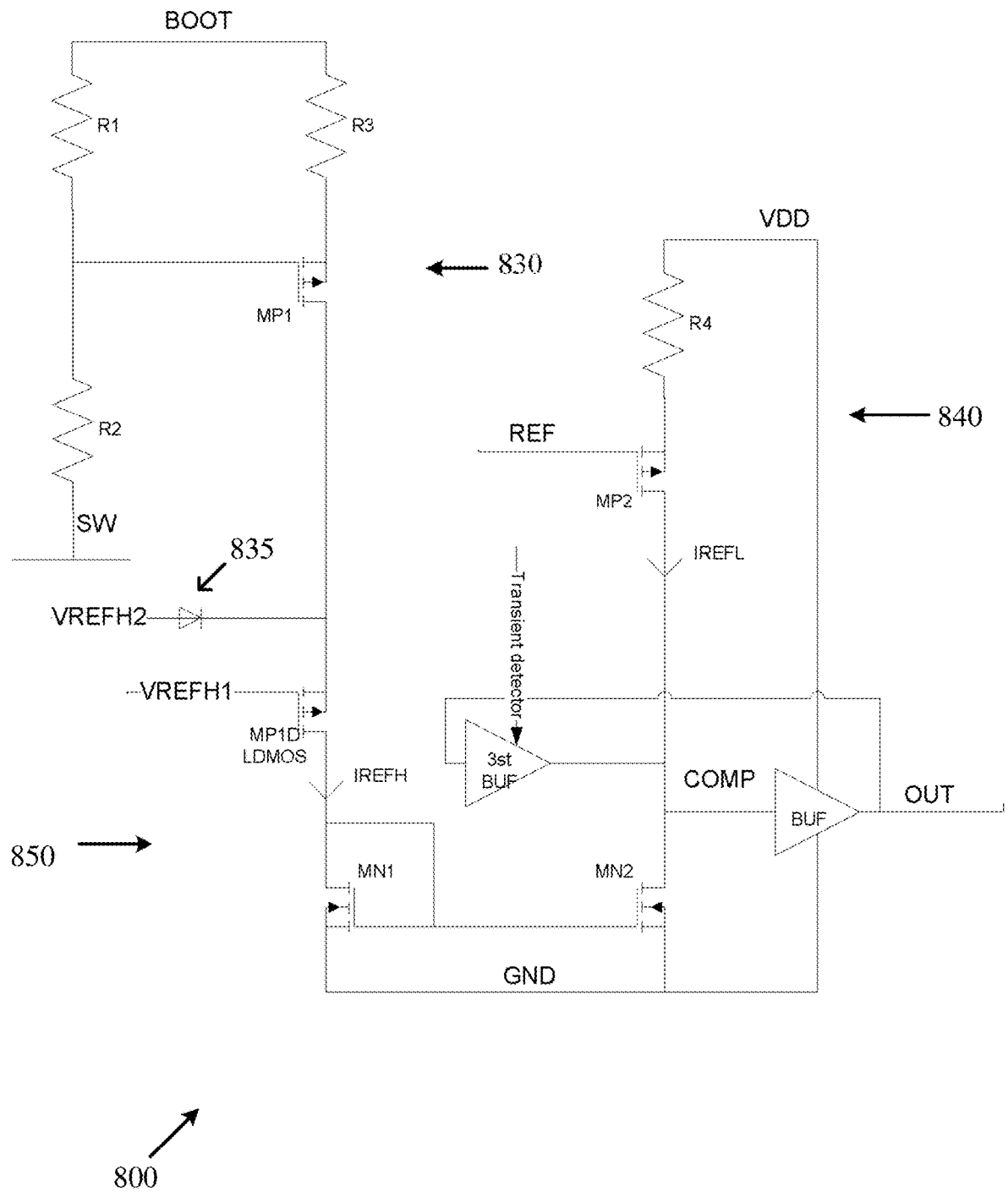
FIG. 8 is a schematic illustration of a low voltage detector architecture, in accordance with some demonstrative embodiments.

Reference is made to FIG. 8, which schematically illustrates a low voltage detector architecture 800, in accordance with some demonstrative embodiments.

In one example, low voltage detector 800 may be configured to perform the functionality of, one or more operations of, one or more functionalities of, and/or the role of low voltage detector 100 (FIG. 1).

In one example, low voltage detector 100 (FIG. 1) may include one or more elements and/or components of low voltage detector 800.

In some demonstrative embodiments, as shown in FIG. 8, low voltage detector 800 may include a first current generator 830 to generate a first reference current 831, denoted "IREFH", and a second current generator 840 to generate a second reference current 841, denoted "IREFL". For example, current generator 830 may include, may be configured to perform the functionality of, one or more operations of, one or more functionalities of, and/or may perform the role of current generator 730 (FIG. 7), and/or current generator 840 may include, may be configured to perform the functionality of, one or more operations of, one or more functionalities of, and/or may perform the role of current generator 740 (FIG. 7).

In some demonstrative embodiments, as shown in FIG. 8, low voltage detector 800 may include a detector component 850. For example, detector component 850 may include, may be configured to perform the functionality of, one or more operations of, one or more functionalities of, and/or may perform the role of detector component 750 (FIG. 7).

In some demonstrative embodiments, as shown in FIG. 8, first current generator 830 may include a voltage clamping component 835 configured to clamp a voltage of the drain of a MOS transistor, denoted "MP1", of first current generator 830.

In some demonstrative embodiments, as shown in FIG. 8, voltage clamping component 835 may include a diode. In other embodiments, voltage clamping component 835 may include any other voltage clamping element.

In some demonstrative embodiments, the voltage clamping component 835 may be configured to clamp the voltage of the drain of the MOS transistor MP1 to a difference between a reference voltage, denoted "VREFH2" of the high-side voltage domain, and a drain voltage, denoted "VD" of the MOS transistor MP1. For example, voltage clamping component 835 may be configured to clamp the voltage of the drain of the MOS transistor MP1, e.g., to a VREFH2–VD voltage.

Figure 9:
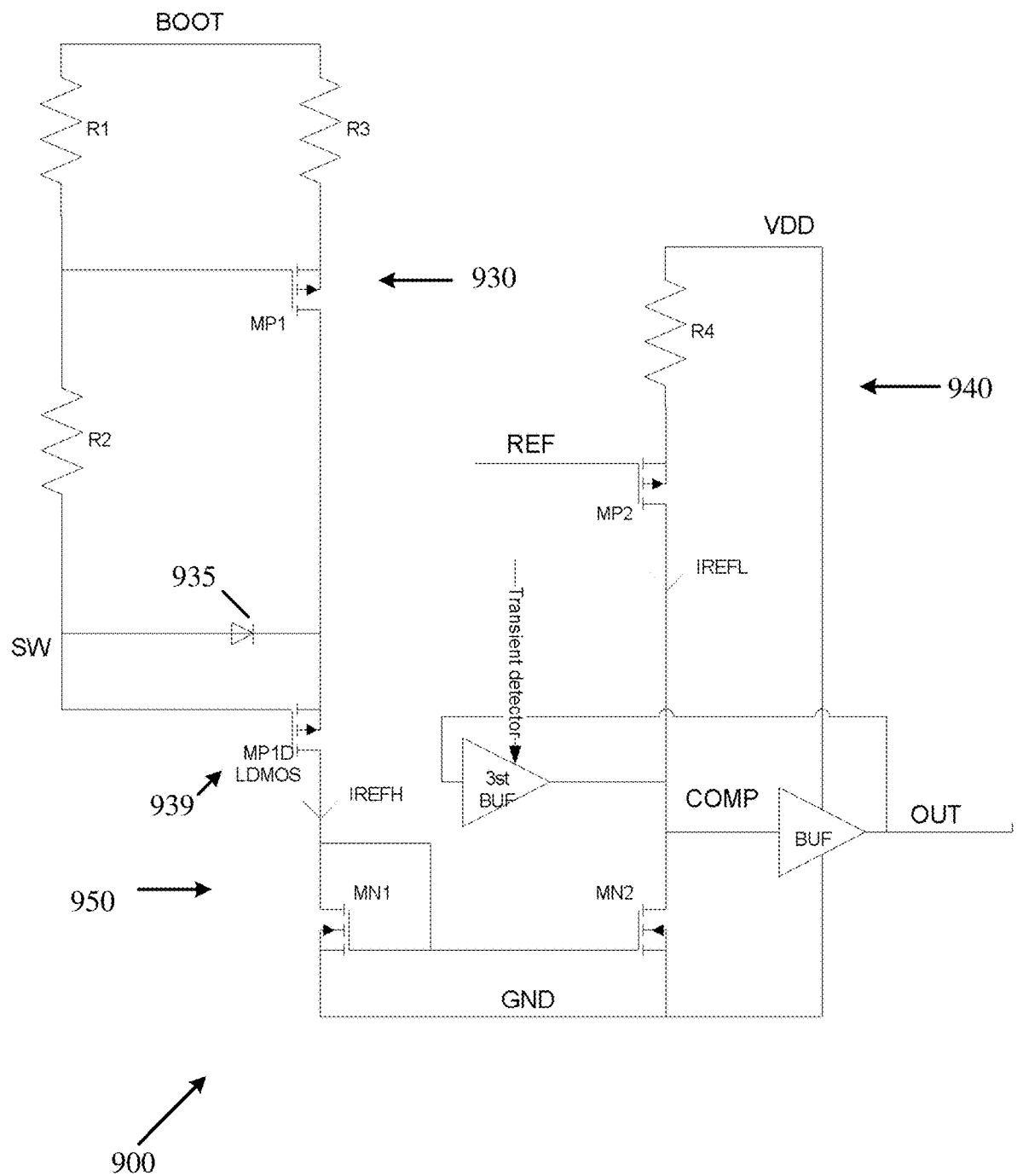
FIG. 9 is a schematic illustration of a low voltage detector architecture, in accordance with some demonstrative embodiments.

Reference is made to FIG. 9, which schematically illustrates a low voltage detector architecture 900, in accordance with some demonstrative embodiments.

In one example, low voltage detector 900 may be configured to perform the functionality of, one or more operations of, one or more functionalities of, and/or the role of low voltage detector 100 (FIG. 1).

In one example, low voltage detector 100 (FIG. 1) may include one or more elements and/or components of low voltage detector 900.

In some demonstrative embodiments, as shown in FIG. 9, low voltage detector 900 may include a first current generator 930 to generate a first reference current 931, denoted "IREFH", and a second current generator 940 to generate a second reference current 941, denoted "IREFL". For example, current generator 930 may include, may be configured to perform the functionality of, one or more operations of, one or more functionalities of, and/or may perform the role of current generator 730 (FIG. 7), and/or current generator 940 may include, may be configured to perform the functionality of, one or more operations of, one or more functionalities of, and/or may perform the role of current generator 740 (FIG. 7).

In some demonstrative embodiments, as shown in FIG. 9, low voltage detector 900 may include a detector component 950. For example, detector component 950 may include, may be configured to perform the functionality of, one or more operations of, one or more functionalities of, and/or may perform the role of detector component 750 (FIG. 7).

In some demonstrative embodiments, as shown in FIG. 9, first current generator 930 may include a voltage clamping component 935 configured to clamp a voltage of the drain of a MOS transistor, denoted "MP1", of first current generator 930.

In some demonstrative embodiments, as shown in FIG. 9, voltage clamping component 935 may include a diode. In other embodiments, voltage clamping component 935 may include any other voltage clamping element.

In some demonstrative embodiments, the voltage clamping component 935 may be configured to clamp the voltage of the drain of the MOS transistor MP1 to a difference between a difference between the SW voltage and a drain voltage, denoted "VD" of the MOS transistor MP1. For example, voltage clamping component 935 may be configured to clamp the voltage of the drain of the MOS transistor MP1, e.g., to SW-VD voltage.

In some demonstrative embodiments, as shown in FIG. 9, voltage clamping component 935 may be between the drain of the MOS transistor MP1 and SW voltage of the first voltage domain In some demonstrative embodiments, as shown in FIG. 9, a gate of a high voltage transistor 939, denoted MP1D, may be coupled to the SW voltage, for example, to protect the MOS transistor MP1 from voltage stressing.

Figure 10:
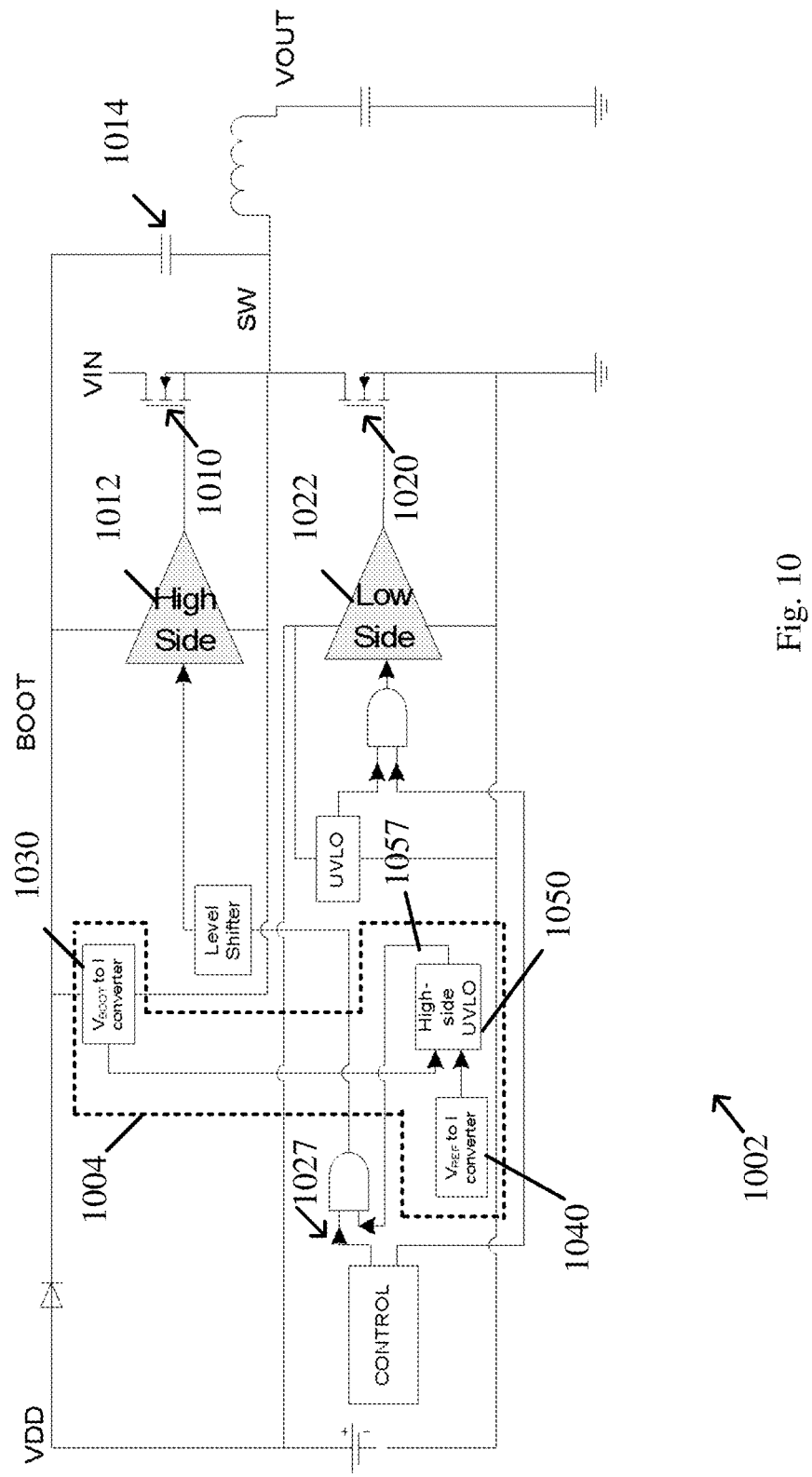
FIG. 10 is a schematic illustration of a DC-DC converter, in accordance with some demonstrative embodiments.

Reference is made to FIG. 10, which schematically illustrates a DC-DC converter 1002, in accordance with some demonstrative embodiments.

In some demonstrative embodiments, DC-DC converter 1002 may be included, and/or may be implemented as part of, an electronic device, e.g., as described below with reference to FIG. 11.

In some demonstrative embodiments, DC-DC converter 1002 may include a switch-mode power supply converter.

In some demonstrative embodiments, DC-DC converter 1002 may include a BUCK converter, or a step-down converter.

In other embodiments, DC-DC converter 1002 may include a BOOST converter or a step-up converter.

In other embodiments, DC-DC converter 1002 may include any other converter

In some demonstrative embodiments, DC-DC converter 1002 may be configured to convert DC signals from an input voltage into an output voltage, e.g., from a VIN-GND voltage into a VOUT-GND voltage, e.g., as described below.

In some demonstrative embodiments, as shown in FIG. 10, DC-DC converter 1002 may include a first driver 1012 to drive a first switch 1010 based on a first voltage of a first voltage domain and a second voltage of the first voltage domain, e.g., as described below.

In some demonstrative embodiments, as shown in FIG. 10, DC-DC converter 1002 may include a second driver 1022 to drive a second switch 1020 based on a first voltage of a second voltage domain and a second voltage of the second voltage domain.

In some demonstrative embodiments, the first voltage domain may include a high-side voltage domain, and/or the second voltage domain may include a low-side voltage domain.

In some demonstrative embodiments, the first voltage of the first voltage domain may include the BOOT voltage, the second voltage of the first voltage domain may include the SW voltage, the first voltage of the second voltage domain may include the VDD voltage, and/or the second voltage of the second voltage domain may include the GND.

In some demonstrative embodiments, as shown in FIG. 10, first switch 1010 may be coupled to the SW voltage. For example, switch 1010 may include a high-side switch.

In some demonstrative embodiments, as shown in FIG. 10, second switch 1020 may be coupled between the SW voltage and the GND voltage. For example, switch 1020 may include a low-side switch.

In some demonstrative embodiments, as shown in FIG. 10, first driver 1012 may be coupled between the BOOT and SW voltages. For example, driver 1012 may include a high-side driver.

In some demonstrative embodiments, as shown in FIG. 10, second driver 1022 may be coupled between the VDD and GND voltages. For example, driver 1022 may include a low-side driver.

In some demonstrative embodiments, driver 1012 may be operated by a floating voltage, for example, the BOOT voltage, e.g., a Boot-Strap-voltage.

In some demonstrative embodiments, the BOOT voltage may be generated, for example, by charging a capacitor 1014, e.g., a BOOT capacitor, from voltage rails of a power source 1030, for example, during a time period in which switch 1020 is at an on-state.

In some demonstrative embodiments, DC-DC converter 1002 may include a low-voltage detector 1004 configured to detect whether a voltage difference between the BOOT and SW voltages is lower than a predefined voltage. For example, low voltage detector 1004 may be configured to perform the functionality of, one or more operations of, one or more functionalities of, and/or the role of low voltage detector 100 (FIG. 1).

In one example, BOOT capacitor 1014 may not have sufficient energy to operate the driver 1012, for example, if the voltage difference between the BOOT and SW voltages, e.g., the BOOT-SW voltage, is lower than the predefined voltage.

In one example, low-voltage detector 1004 may be configured to detect, for example, when driver 1012 is incapable and/or unable to drive switch 1010, e.g., as described below.

In one example, one or more scenarios and/or use cases may cause the BOOT capacitor 1014 to be incapable and/or unable to effectively and/or efficiently operate the driver 1012, for example, if BOOT capacitor 1014 does not have sufficient energy to operate the driver 1012, e.g., as descried above.

In some demonstrative embodiments, as shown in FIG. 10, low-voltage detector 1004 may include a first current generator 1030 configured to generate a first reference current based on the difference between the BOOT and the SW voltages.

In some demonstrative embodiments, as shown in FIG. 10, low-voltage detector 1004 may include a second current generator 1040 configured to generate a second reference current based on the difference between the VDD voltage and the reference voltage REF.

In some demonstrative embodiments, as shown in FIG. 10, low-voltage detector 1004 may include a detector component 1050 to detect whether the voltage difference is lower than the predefined voltage, for example, based on the first reference current and the second reference current, e.g., as described above.

In some demonstrative embodiments, the detector component 1050 may be configured to detect whether the voltage difference is lower than the predefined voltage, for example, when the first switch 1010 is at an on-state and the second switch 1020 is at an off-state.

In some demonstrative embodiments, the detector component 1050 may be configured to detect whether the voltage difference is lower than the predefined voltage, for example, when the first switch 1010 is at an off-state and the second switch 1020 is at an on-state, and/or when the first switch 1010 and the second switch 1020 are at the off-state.

In some demonstrative embodiments, detector component 1050 may be configured to trigger switching off the first switch 1010 and/or switching on the second switch 1020, for example, upon detection that the voltage difference is lower than the predefined voltage.

In some demonstrative embodiments, detector component 1050 may be configured to output a signal 1057 to indicate to control circuitry 1027, for example, that the voltage difference is lower than the predefined voltage.

In some demonstrative embodiments, control circuitry 1027 may be configured, for example, to trigger switching-off of switch 1010 and/or 1020, for example, upon receiving signal 1057 indicating that the voltage difference is lower than the predefined voltage.

Figure 11:
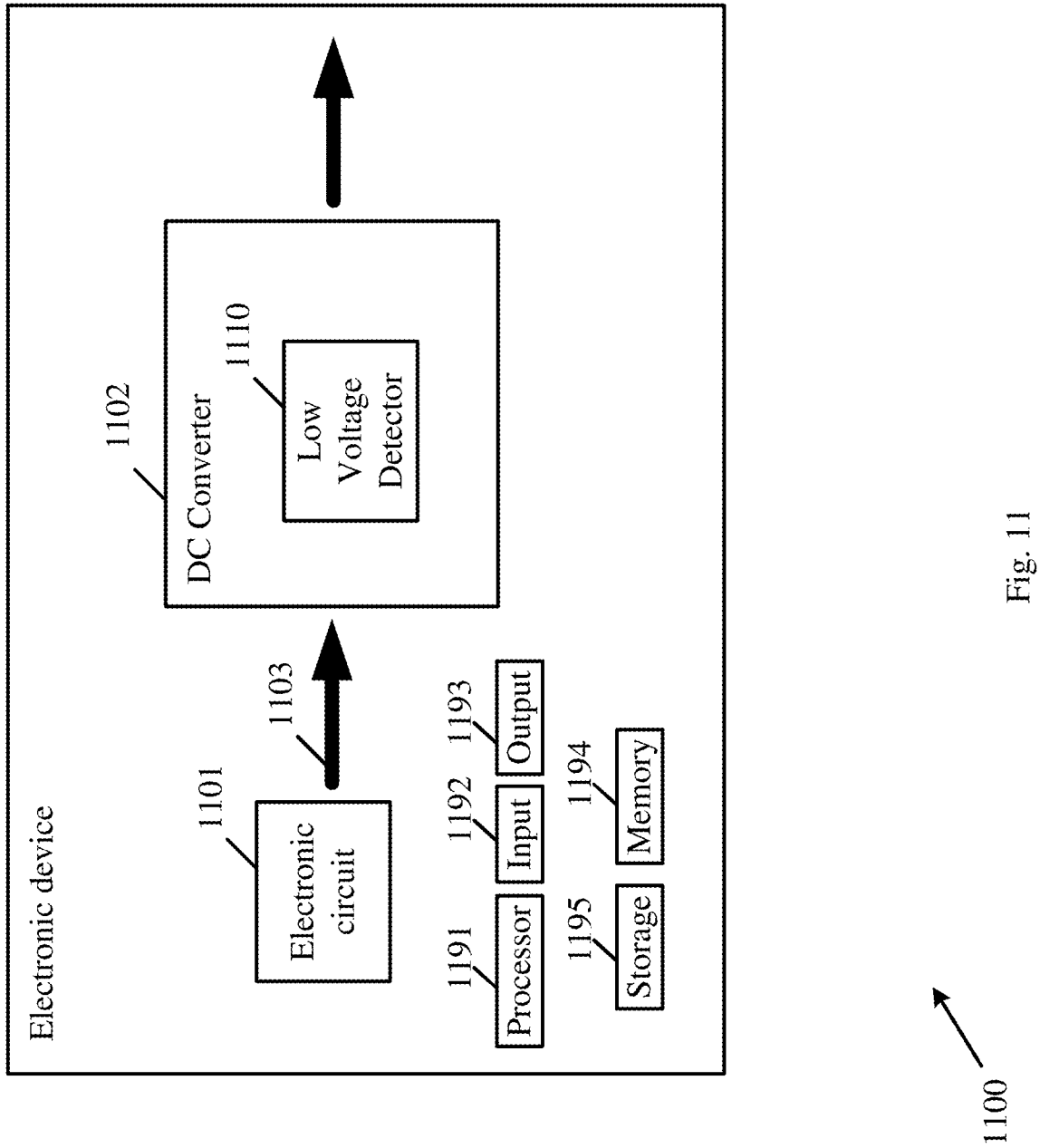
FIG. 11 is a schematic block diagram illustration of an electronic device, in accordance with some demonstrative embodiments.

Reference is made to FIG. 11, which schematically illustrates a block diagram of an electronic device 1100, in accordance with some demonstrative embodiments.

In some demonstrative embodiments, electronic device 1000 may include, for example, a computing device, an electrical device, a mobile device, a mobile phone, a Smartphone, a mobile computer, a laptop computer, a notebook computer, a tablet computer, a handheld computer, an Internet of Things (IoT) device, a power charging device, a power supply device, a sensor device, a handheld device, a wearable device, a gaming device, digital camera, a media player, a music player, or the like.

In some demonstrative embodiments, electronic device 1100 may include an electronic circuit 1101 configured to perform one more functionalities of electronic device 1100.

In some demonstrative embodiments, electronic circuit 1101 may include an Integrated Circuit (IC) and/or any other circuitry.

In some demonstrative embodiments, electronic circuitry 1101 may be configured to generate a DC control signal 1103.

In some demonstrative embodiments, electronic device 1100 may include a DC-DC converter 1102 to convert logic levels of the DC control signal 1103 from a first voltage domain to a second voltage domain. For example, DC-DC converter 1102 may perform one or more operations of, the functionality of, and/or the role of DC-DC converter 1002 (FIG. 10).

In some demonstrative embodiments, DC-DC converter 1102 may be configured to convert DC signals from an input voltage into an output voltage, e.g., from a VIN-GND voltage into a VOUT-GND voltage, e.g., as described below.

In some demonstrative embodiments, DC-DC converter 1102 may include a first driver to drive a first switch, for example, based on a first voltage of a first voltage domain and a second voltage of the first voltage domain, e.g., as described below.

In some demonstrative embodiments, as shown in FIG. 11, DC-DC converter 1102 may include a second driver to drive a second switch, for example, based on a first voltage of a second voltage domain and a second voltage of the second voltage domain.

In some demonstrative embodiments, the first voltage domain may include a high-side voltage domain, and/or the second voltage domain may include a low-side voltage domain.

In some demonstrative embodiments, the first voltage of the first voltage domain may include the BOOT voltage, the second voltage of the first voltage domain may include the SW voltage, the first voltage of the second voltage domain may include the VDD voltage, and/or the second voltage of the second voltage domain may include the GND.

In some demonstrative embodiments, DC-DC converter 1102 may include a low-voltage detector 1110 configured to detect whether a voltage difference between the BOOT and SW voltages is lower than a predefined voltage. For example, low-voltage detector 1110 may be configured to perform the functionality of, one or more operations of, one or more functionalities of, and/or the role of low-voltage detector 1004 (FIG. 10) and/or 100 (FIG. 1).

In some demonstrative embodiments, electronic device 1100 may also include, for example, one or more of a processor 1191, an input unit 1192, an output unit 1193, a memory unit 1194, and/or a storage unit 1195. Electronic device 1100 may optionally include other suitable hardware components and/or software components. In some demonstrative embodiments, some or all of the components of one or more of electronic device 1100 may be enclosed in a common housing or packaging, and may be interconnected or operably associated using one or more wired or wireless links.

In some demonstrative embodiments, processor 1191 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 1191 may execute instructions, for example, of an Operating System (OS) of electronic device 1100 and/or of one or more suitable applications.

In some demonstrative embodiments, input unit 1192 may include, for example, a keyboard, a keypad, a mouse, a touch-screen, a touch-pad, a track-ball, a stylus, a microphone, or other suitable pointing device or input device. Output unit 1193 may include, for example, a monitor, a screen, a touch-screen, a flat panel display, a Light Emitting Diode (LED) display unit, a Liquid Crystal Display (LCD) display unit, a plasma display unit, one or more audio speakers or earphones, or other suitable output devices.

In some demonstrative embodiments, memory unit 1194 may includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 1195 may include, for example, a hard disk drive, a floppy disk drive, a Compact Disk (CD) drive, a CD-ROM drive, a DVD drive, or other suitable removable or non-removable storage units. Memory unit 1194 and/or storage unit 1195, for example, may store data processed by electronic device 1100.

EXAMPLES

The following examples pertain to further embodiments.

Example 1 includes an apparatus comprising a low-voltage detector to detect whether a voltage difference between a first voltage of a first voltage domain and a second voltage of the first voltage domain is lower than a predefined voltage, the low-voltage detector comprising a first current generator configured to generate a first reference current based on a difference between the first voltage of the first voltage domain and the second voltage of the first voltage domain; a second current generator configured to generate a second reference current based on a difference between a voltage of a second voltage domain and a reference voltage; and a detector component to detect whether the voltage difference is lower than the predefined voltage based on the first reference current and the second reference current.

Example 2 includes the subject matter of Example 1, and optionally, wherein the detector component is configured to detect whether the voltage difference is lower than the predefined voltage, when the first voltage domain is at a switching mode and the second voltage domain is at a fixed mode.

Example 3 includes the subject matter of Example 1 or 2, and optionally, comprising a first switch coupled to the second voltage of the first voltage domain and a second switch coupled to the second voltage of the first voltage domain, the detector component configured to detect whether the voltage difference is lower than the predefined voltage, when the first switch is at an on-state and the second switch is at an off-state.

Example 4 includes the subject matter of Example 3, and optionally, wherein the detector component is configured to, upon detection that the voltage difference is lower than the predefined voltage, trigger at least one of switching off the first switch or switching on the second switch.

Example 5 includes the subject matter of any one of Examples 1-4, and optionally, wherein the detector component comprises a current mirror configured to generate a mirrored reference current based on the first reference current, the detector component configured to detect whether the voltage difference is lower than the predefined voltage based on a comparison between the mirrored reference current and the second reference current.

Example 6 includes the subject matter of Example 5, and optionally, wherein the detector component comprises a comparison node between the current mirror and the second current generator, the comparison node to provide a current difference between the mirrored reference current and the second reference current.

Example 7 includes the subject matter of Example 6, and optionally, wherein the detector component comprises a comparison buffer to receive the current difference from the comparison node, and, based on the current difference, to output a signal to indicate that the voltage difference is lower than the predefined voltage.

Example 8 includes the subject matter of Example 7, and optionally, wherein the detector component comprises a three state buffer coupled between the comparison node and an output of the comparison buffer, the three state buffer configured to latch the comparison node to the output of the comparison buffer based on a detection of a transient event in the first voltage domain.

Example 9 includes the subject matter of Example 8, and optionally, comprising a transient detection circuit configured to detect the transient event, and, based on a detection of the transient event, to provide a transient signal to an input of the three state buffer.

Example 10 includes the subject matter of any one of Examples 1-9, and optionally, wherein the first current generator comprises a first metal-oxide-semiconductor (MOS) transistor, and the second current generator comprises a second MOS transistor, the first reference current is driven via a drain of the first MOS transistor and the second reference current is driven via a drain of the second MOS transistor.

Example 11 includes the subject matter of Example 10, and optionally, wherein the first current generator comprises a high voltage transistor configured to prevent a voltage stress over the first MOS transistor, a source of the high voltage transistor is coupled to the drain of the first MOS transistor.

Example 12 includes the subject matter of Example 11, and optionally, wherein a gate of the high voltage transistor is coupled to a reference voltage of the first voltage domain.

Example 13 includes the subject matter of Example 11, and optionally, wherein a gate of the high voltage transistor is coupled to the second voltage of the first voltage domain.

Example 14 includes the subject matter of any one of Examples 11-13, and optionally, wherein the high voltage transistor comprises a Lateral Diffused MOS (LDMOS) transistor.

Example 15 includes the subject matter of any one of Examples 10-14, and optionally, wherein the first current generator comprises a voltage clamping component configured to clamp a voltage of the drain of the first MOS transistor.

Example 16 includes the subject matter of Example 15, and optionally, wherein the voltage clamping component is configured to clamp the voltage of the drain of the first MOS transistor to a difference between a reference voltage of the first voltage domain and a drain voltage of the first MOS transistor, the voltage clamping component is between the drain of the first MOS transistor and the reference voltage of the first voltage domain.

Example 17 includes the subject matter of Example 15, and optionally, wherein the voltage clamping component is configured to clamp the voltage of the drain of the first MOS transistor to a difference between the second voltage of the first voltage domain and a drain voltage of the first MOS transistor, the voltage clamping component is between the drain of the first MOS transistor and the second voltage of the first voltage domain.

Example 18 includes the subject matter of any one of Examples 15-17, and optionally, wherein the voltage clamping component comprises a diode.

Example 19 includes the subject matter of any one of Examples 10-18, and optionally, wherein the first current generator comprises first and second loads coupled in series between the first voltage of the first voltage domain and the second voltage of the first voltage domain, and a third load between the first voltage of the first voltage domain and a source of the first MOS transistor, the second current generator comprises a fourth load between the first voltage of the second voltage domain and a source of the second MOS transistor.

Example 20 includes the subject matter of Example 19, and optionally, wherein a gate voltage of the first MOS transistor comprises a voltage at a node between the first and second loads, and a gate voltage of the second MOS transistor comprises the reference voltage.

Example 21 includes the subject matter of Example 19 or 20, and optionally, wherein the first and second loads are equal, the third and fourth loads are equal, and the first and second MOS transistors are identical.

Example 22 includes the subject matter of any one of Examples 10-21, and optionally, wherein each of the first and second MOS transistors comprises a P-channel MOS (PMOS) transistor, a high voltage MOS transistor, or a Lateral Diffused MOS (LDMOS) transistor.

Example 23 includes the subject matter of any one of Examples 1-22, and optionally, wherein the first voltage domain comprises a high-side voltage domain, and the second voltage domain comprises a low-side voltage domain.

Example 24 includes the subject matter of any one of Examples 1-23, and optionally, wherein the first voltage of the first voltage domain comprises a BOOT voltage, the second voltage of the first voltage domain comprises a switching (SW) voltage, the voltage of the second voltage domain comprises a drain-drain voltage (VDD), and the reference voltage comprises a bandgap voltage.

Example 25 includes the subject matter of any one of Examples 1-24, and optionally, wherein the low-voltage detector comprises a high-side Under Voltage Lock Out (UVLO).

Example 26 includes an electronic device comprising a DC to DC (DC-DC) converter comprising a first driver to drive a first switch based on a first voltage of a first voltage domain and a second voltage of the first voltage domain; a second driver to drive a second switch based on a first voltage of a second voltage domain and a second voltage of the second voltage domain; and a low-voltage detector to detect whether a voltage difference between the first voltage of the first voltage domain and the second voltage of the first voltage domain is lower than a predefined voltage, the low-voltage detector comprising a first current generator configured to generate a first reference current based on a difference between the first voltage of the first voltage domain and the second voltage of the first voltage domain; a second current generator configured to generate a second reference current based on a difference between the first voltage of the second voltage domain and a reference voltage; and a detector component to detect whether the voltage difference is lower than the predefined voltage based on the first reference current and the second reference current.

Example 27 includes the subject matter of Example 26, and optionally, wherein the detector component is configured to detect whether the voltage difference is lower than the predefined voltage, when the first voltage domain is at a switching mode and the second voltage domain is at a fixed mode.

Example 28 includes the subject matter of Example 26 or 27, and optionally, wherein the low-voltage detector comprises a first switch coupled to the second voltage of the first voltage domain and a second switch coupled to the second voltage of the first voltage domain, the detector component configured to detect whether the voltage difference is lower than the predefined voltage, when the first switch is at an on-state and the second switch is at an off-state.

Example 29 includes the subject matter of Example 28, and optionally, wherein the detector component is configured to, upon detection that the voltage difference is lower than the predefined voltage, trigger at least one of switching off the first switch or switching on the second switch.

Example 30 includes the subject matter of any one of Examples 26-29, and optionally, wherein the detector component comprises a current mirror configured to generate a mirrored reference current based on the first reference current, the detector component configured to detect whether the voltage difference is lower than the predefined voltage based on a comparison between the mirrored reference current and the second reference current.

Example 31 includes the subject matter of Example 30, and optionally, wherein the detector component comprises a comparison node between the current mirror and the second current generator, the comparison node to provide a current difference between the mirrored reference current and the second reference current.

Example 32 includes the subject matter of Example 31, and optionally, wherein the detector component comprises a comparison buffer to receive the current difference from the comparison node, and, based on the current difference, to output a signal to indicate that the voltage difference is lower than the predefined voltage.

Example 33 includes the subject matter of Example 32, and optionally, wherein the detector component comprises a three state buffer coupled between the comparison node and an output of the comparison buffer, the three state buffer configured to latch the comparison node to the output of the comparison buffer based on a detection of a transient event in the first voltage domain.

Example 34 includes the subject matter of Example 33, and optionally, wherein the low-voltage detector comprises a transient detection circuit configured to detect the transient event, and, based on a detection of the transient event, to provide a transient signal to an input of the three state buffer.

Example 35 includes the subject matter of any one of Examples 26-34, and optionally, wherein the first current generator comprises a first metal-oxide-semiconductor (MOS) transistor, and the second current generator comprises a second MOS transistor, the first reference current is driven via a drain of the first MOS transistor and the second reference current is driven via a drain of the second MOS transistor.

Example 36 includes the subject matter of Example 35, and optionally, wherein the first current generator comprises a high voltage transistor configured to prevent a voltage stress over the first MOS transistor, a source of the high voltage transistor is coupled to the drain of the first MOS transistor.

Example 37 includes the subject matter of Example 36, and optionally, wherein a gate of the high voltage transistor is coupled to a reference voltage of the first voltage domain.

Example 38 includes the subject matter of Example 36, and optionally, wherein a gate of the high voltage transistor is coupled to the second voltage of the first voltage domain.

Example 39 includes the subject matter of any one of Examples 36-38, and optionally, wherein the high voltage transistor comprises a Lateral Diffused MOS (LDMOS) transistor.

Example 40 includes the subject matter of any one of Examples 35-39, and optionally, wherein the first current generator comprises a voltage clamping component configured to clamp a voltage of the drain of the first MOS transistor.

Example 41 includes the subject matter of Example 40, and optionally, wherein the voltage clamping component is configured to clamp the voltage of the drain of the first MOS transistor to a difference between a reference voltage of the first voltage domain and a drain voltage of the first MOS transistor, the voltage clamping component is between the drain of the first MOS transistor and the reference voltage of the first voltage domain.

Example 42 includes the subject matter of Example 40, and optionally, wherein the voltage clamping component is configured to clamp the voltage of the drain of the first MOS transistor to a difference between the second voltage of the first voltage domain and a drain voltage of the first MOS transistor, the voltage clamping component is between the drain of the first MOS transistor and the second voltage of the first voltage domain.

Example 43 includes the subject matter of any one of Examples 40-42, and optionally, wherein the voltage clamping component comprises a diode.

Example 44 includes the subject matter of any one of Examples 35-43, and optionally, wherein the first current generator comprises first and second loads coupled in series between the first voltage of the first voltage domain and the second voltage of the first voltage domain, and a third load between the first voltage of the first voltage domain and a source of the first MOS transistor, the second current generator comprises a fourth load between the first voltage of the second voltage domain and a source of the second MOS transistor.

Example 45 includes the subject matter of Example 44, and optionally, wherein a gate voltage of the first MOS transistor comprises a voltage at a node between the first and second loads, and a gate voltage of the second MOS transistor comprises the reference voltage.

Example 46 includes the subject matter of Example 44 or 45, and optionally, wherein the first and second loads are equal, the third and fourth loads are equal, and the first and second MOS transistors are identical.

Example 47 includes the subject matter of any one of Examples 35-46, and optionally, wherein each of the first and second MOS transistors comprises a P-channel MOS (PMOS) transistor, a high voltage MOS transistor, or a Lateral Diffused MOS (LDMOS) transistor.

Example 48 includes the subject matter of any one of Examples 26-47, and optionally, wherein the first voltage domain comprises a high-side voltage domain, and the second voltage domain comprises a low-side voltage domain.

Example 49 includes the subject matter of any one of Examples 26-48, and optionally, wherein the first voltage of the first voltage domain comprises a BOOT voltage, the second voltage of the first voltage domain comprises a switching (SW) voltage, the voltage of the second voltage domain comprises a drain-drain voltage (VDD), and the reference voltage comprises a bandgap voltage.

Example 50 includes the subject matter of any one of Examples 26-49, and optionally, wherein the low-voltage detector comprises a high-side Under Voltage Lock Out (UVLO).

Example 51 includes the subject matter of Examples 26-50, and optionally, wherein the DC-DC converter comprises a buck converter or a step-down converter.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising a low-voltage detector to detect whether a voltage difference between a first voltage of a first voltage domain and a second voltage of the first voltage domain is lower than a predefined voltage, the low-voltage detector comprising:
    a first current generator configured to generate a first reference current based on a difference between the first voltage of the first voltage domain and the second voltage of the first voltage domain;
    a second current generator configured to generate a second reference current based on a difference between a voltage of a second voltage domain and a reference voltage; and
    a detector component to detect whether the voltage difference is lower than the predefined voltage based on the first reference current and the second reference current, wherein the detector component comprises a current mirror configured to generate a mirrored reference current based on the first reference current, the detector component configured to detect whether the voltage difference is lower than the predefined voltage based on a comparison between the mirrored reference current and the second reference current.

2. The apparatus of claim 1, wherein the detector component is configured to detect whether the voltage difference is lower than the predefined voltage, when the first voltage domain is at a switching mode and the second voltage domain is at a fixed mode.

3. The apparatus of claim 1 comprising a first switch coupled to the second voltage of the first voltage domain and a second switch coupled to the second voltage of the first voltage domain, the detector component configured to detect whether the voltage difference is lower than the predefined voltage, when the first switch is at an on-state and the second switch is at an off-state.

4. The apparatus of claim 3, wherein the detector component is configured to, upon detection that the voltage difference is lower than the predefined voltage, trigger at least one of switching off the first switch or switching on the second switch.

5. The apparatus of claim 1, wherein the low-voltage detector comprises a high-side Under Voltage Lock Out (UVLO).

6. The apparatus of claim 1, wherein the detector component comprises a comparison node between the current mirror and the second current generator, the comparison node to provide a current difference between the mirrored reference current and the second reference current.

7. The apparatus of claim 6, wherein the detector component comprises a comparison buffer to receive the current difference from the comparison node, and, based on the current difference, to output a signal to indicate that the voltage difference is lower than the predefined voltage.

8. The apparatus of claim 7, wherein the detector component comprises a three state buffer coupled between the comparison node and an output of the comparison buffer, the three state buffer configured to latch the comparison node to the output of the comparison buffer based on a detection of a transient event in the first voltage domain.

9. The apparatus of claim 8 comprising a transient detection circuit configured to detect the transient event, and, based on a detection of the transient event, to provide a transient signal to an input of the three state buffer.

10. The apparatus of claim 1, wherein the first current generator comprises a first metal-oxide-semiconductor (MOS) transistor, and the second current generator comprises a second MOS transistor, the first reference current is driven via a drain of the first MOS transistor and the second reference current is driven via a drain of the second MOS transistor.

11. The apparatus of claim 10, wherein the first current generator comprises a high voltage transistor configured to prevent a voltage stress over the first MOS transistor, a source of the high voltage transistor is coupled to the drain of the first MOS transistor.

12. The apparatus of claim 11, wherein a gate of the high voltage transistor is coupled to a reference voltage of the first voltage domain.

13. The apparatus of claim 11, wherein a gate of the high voltage transistor is coupled to the second voltage of the first voltage domain.

14. The apparatus of claim 10, wherein the first current generator comprises a voltage clamping component configured to clamp a voltage of the drain of the first MOS transistor.

15. The apparatus of claim 14, wherein the voltage clamping component is configured to clamp the voltage of the drain of the first MOS transistor to a difference between a reference voltage of the first voltage domain and a drain voltage of the first MOS transistor, the voltage clamping component is between the drain of the first MOS transistor and the reference voltage of the first voltage domain.

16. The apparatus of claim 14, wherein the voltage clamping component is configured to clamp the voltage of the drain of the first MOS transistor to a difference between the second voltage of the first voltage domain and a drain voltage of the first MOS transistor, the voltage clamping component is between the drain of the first MOS transistor and the second voltage of the first voltage domain.

17. The apparatus of claim 10, wherein the first current generator comprises first and second loads coupled in series between the first voltage of the first voltage domain and the second voltage of the first voltage domain, and a third load between the first voltage of the first voltage domain and a source of the first MOS transistor, the second current generator comprises a fourth load between the first voltage of the second voltage domain and a source of the second MOS transistor.

18. The apparatus of claim 17, wherein a gate voltage of the first MOS transistor comprises a voltage at a node between the first and second loads, and a gate voltage of the second MOS transistor comprises the reference voltage.

19. The apparatus of claim 17, wherein the first and second loads are equal, the third and fourth loads are equal, and the first and second MOS transistors are identical.

20. The apparatus of claim 1, wherein the first voltage domain comprises a high-side voltage domain, and the second voltage domain comprises a low-side voltage domain.

21. The apparatus of claim 1, wherein the first voltage of the first voltage domain comprises a BOOT voltage, the second voltage of the first voltage domain comprises a switching (SW) voltage, the voltage of the second voltage domain comprises a drain-drain voltage (VDD), and the reference voltage comprises a bandgap voltage.

22. An electronic device comprising:
a DC to DC (DC-DC) converter comprising:
  a first driver to drive a first switch based on a first voltage of a first voltage domain and a second voltage of the first voltage domain;
  a second driver to drive a second switch based on a first voltage of a second voltage domain and a second voltage of the second voltage domain; and
  a low-voltage detector to detect whether a voltage difference between the first voltage of the first voltage domain and the second voltage of the first voltage domain is lower than a predefined voltage, the low-voltage detector comprising:
    a first current generator configured to generate a first reference current based on a difference between the first voltage of the first voltage domain and the second voltage of the first voltage domain;
    a second current generator configured to generate a second reference current based on a difference between the first voltage of the second voltage domain and a reference voltage; and
    a detector component to detect whether the voltage difference is lower than the predefined voltage based on the first reference current and the second reference current, wherein the detector component comprises a current mirror configured to generate a mirrored reference current based on the first reference current, the detector component configured to detect whether the voltage difference is lower than the predefined voltage based on a comparison between the mirrored reference current and the second reference current.

23. The electronic device of claim 22, wherein the DC-DC converter comprises a buck converter or a step-down converter.

* * * * *